US010897271B2

(12) United States Patent
Galbraith et al.

(10) Patent No.: US 10,897,271 B2
(45) Date of Patent: Jan. 19, 2021

(54) MULTI-DIMENSIONAL QUASI-CYCLIC (QC) LOW-DENSITY PARITY-CHECK (LDPC) CODE CONSTRUCTIONS

(71) Applicant: Western Digital Technologies, Inc., San Jose, CA (US)

(72) Inventors: Richard Leo Galbraith, Rochester, MN (US); Iouri Oboukhov, Rochester, MN (US); Niranjay Ravindran, Rochester, MN (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 170 days.

(21) Appl. No.: 16/152,128

(22) Filed: Oct. 4, 2018

(65) Prior Publication Data

US 2020/0112322 A1  Apr. 9, 2020

(51) Int. Cl.
*H03M 13/11* (2006.01)
*G11C 29/52* (2006.01)
(Continued)

(52) U.S. Cl.
CPC ....... *H03M 13/116* (2013.01); *G06F 11/1068* (2013.01); *G11C 29/52* (2013.01); *H03M 13/1102* (2013.01); *H03M 13/1148* (2013.01); *H03M 13/1157* (2013.01); *H03M 13/1165* (2013.01); *H03M 13/1168* (2013.01); *H03M 13/1177* (2013.01); *H03M 13/1185* (2013.01); *H03M 13/15* (2013.01);
(Continued)

(58) Field of Classification Search
CPC ............. H03M 13/116; H03M 13/616; H03M 13/1165; H03M 13/255; H03M 13/1102; H03M 13/1185; H03M 13/1177; H03M 13/1168; H03M 13/1148; H03M 13/2906; H03M 13/1157; H03M 13/15; G11C 29/52; G06F 11/1068
See application file for complete search history.

(56) References Cited

U.S. PATENT DOCUMENTS

| | | | | |
|---|---|---|---|---|
| 2010/0023838 | A1* | 1/2010 | Shen | H03M 13/1105 714/758 |
| 2010/0275093 | A1* | 10/2010 | McLaughlin | H03M 13/033 714/752 |
| 2015/0095747 | A1* | 4/2015 | Tamo | H03M 13/373 714/781 |

OTHER PUBLICATIONS

Mark Laubach et al., FEC Proposal for NGEPON—update, BROADCOM, Jul. 3, 2017 <http://www.ieee802.org/3/ca/public/meeting_archive/2017/07/laubach_3ca_1_0717.pdf>.

(Continued)

*Primary Examiner* — April Y Blair
*Assistant Examiner* — Sazzad Hossain
(74) *Attorney, Agent, or Firm* — Loza & Loza, LLP; Gabriel Fitch

(57) ABSTRACT

The disclosure relates in some aspects to multi-dimensional quasi-cyclic (QC) low-density parity-check (LDPC) code generation. In one example, a controller of a data storage apparatus determines a plurality of dimensions for a code, the plurality of dimensions comprising a plurality of coprime numbers, generates distinct circulant rotation values based on at least a root of unity number and a prime number, assigns a different one of the distinct circulant rotation values to each of a plurality of circulant locations defined within the plurality of dimensions to generate the code, and encodes data using the code.

22 Claims, 18 Drawing Sheets

(51) Int. Cl.
  *G06F 11/10* (2006.01)
  *H03M 13/25* (2006.01)
  *H03M 13/00* (2006.01)
  *H03M 13/29* (2006.01)
  *H03M 13/15* (2006.01)

(52) U.S. Cl.
  CPC ...... *H03M 13/255* (2013.01); *H03M 13/2906* (2013.01); *H03M 13/616* (2013.01)

(56) References Cited

OTHER PUBLICATIONS

Mark Laubach et al., LDPC Panty Code Matrix Update for Improved Alignment (rev 1a), BROADCOM, Mar. 5, 2018, IEEE 802.3 Plenary, Chicago, IL, USA <http://www.ieee802.org/3/ca/public/meeting_archive/2018/03/laubach_3ca_1a_0318.pdf>.

* cited by examiner

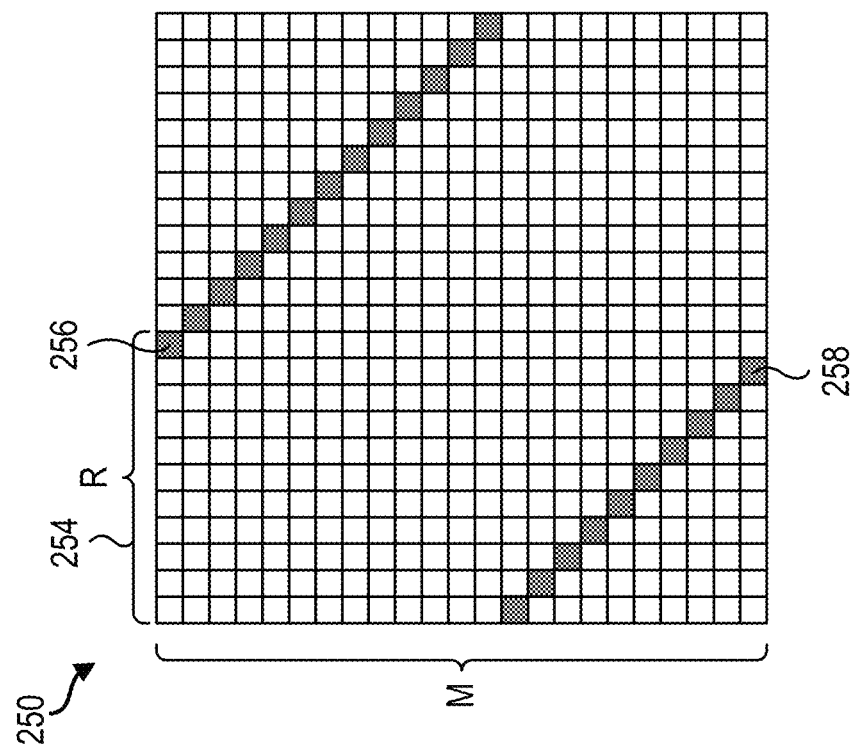
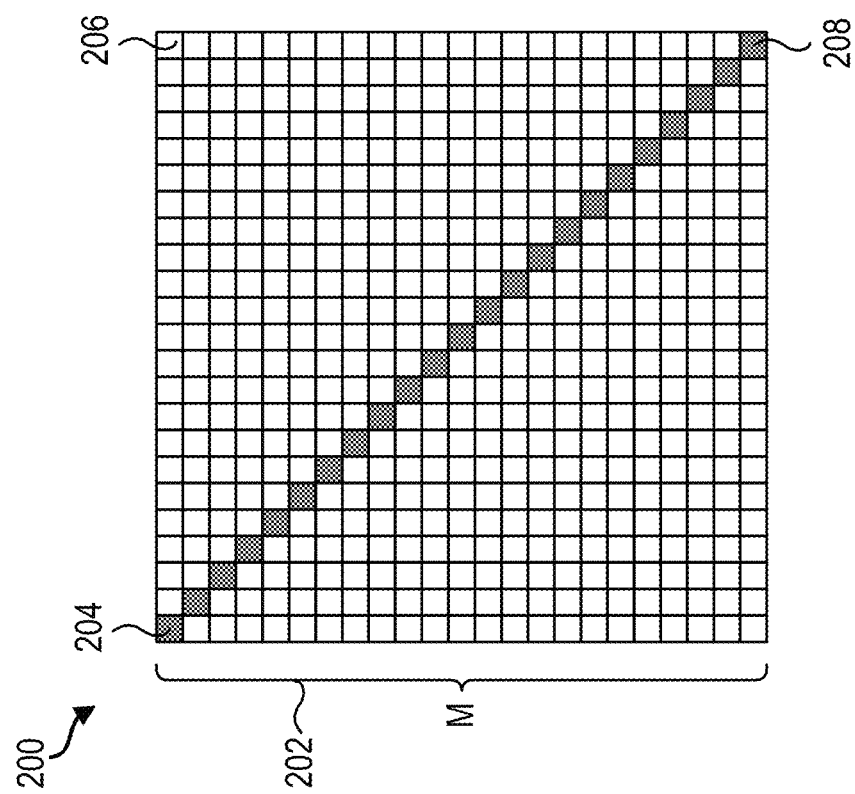
FIG. 2

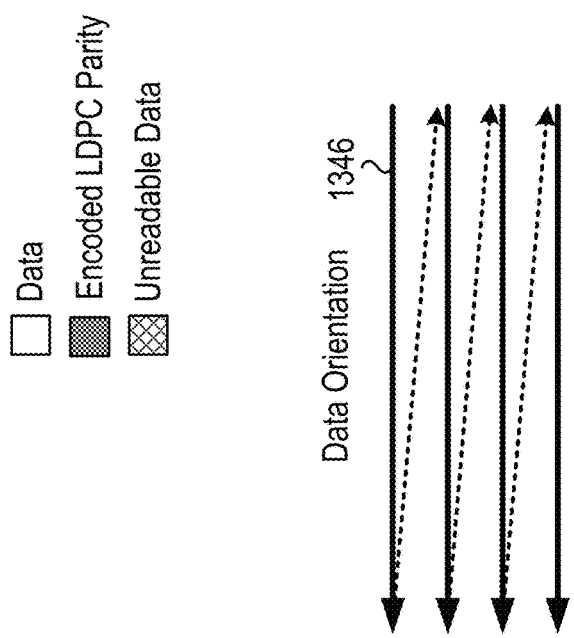
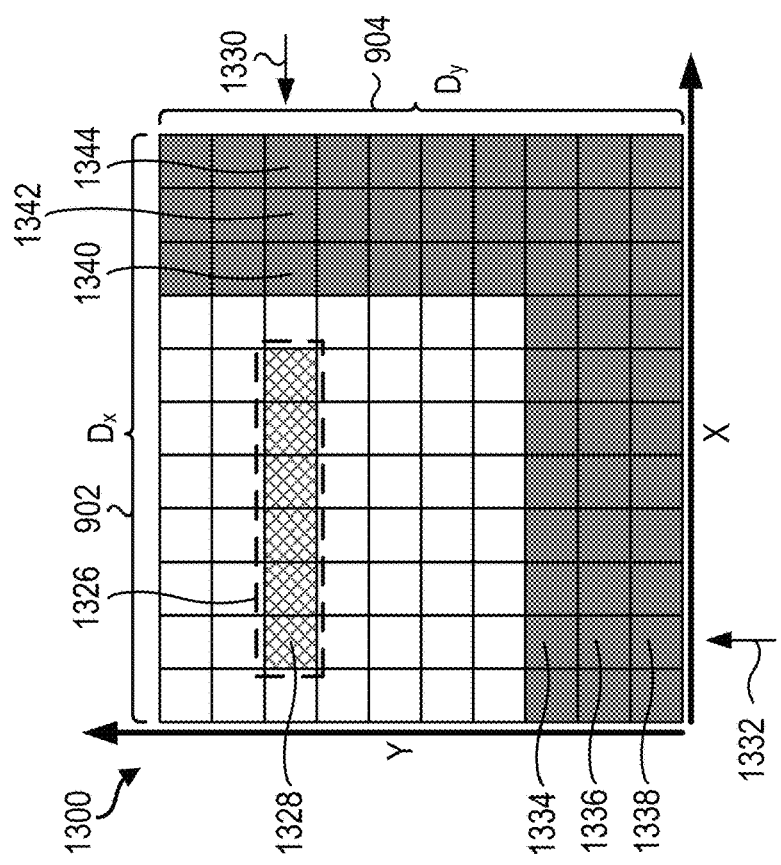
FIG. 13B
FIG. 13A

MULTI-DIMENSIONAL QUASI-CYCLIC (QC) LOW-DENSITY PARITY-CHECK (LDPC) CODE CONSTRUCTIONS

FIELD

The disclosure relates, in some embodiments, to data storage devices and controllers for use therewith. More specifically, but not exclusively, the disclosure relates to multi-dimensional quasi-cyclic (QC) low-density parity-check (LDPC) code constructions for encoding data stored on a data storage device.

INTRODUCTION

Conventional quasi-cyclic (QC) low-density parity-check (LDPC) code construction techniques typically view the QC-LDPC code as an H-matrix. The H-matrix is a planar construct where the parity check equations (PCE) are one-dimensional as rows of the H-matrix. This limitation in design concept results in QC-LDPC codes that do not significantly improve the properties as the QC-LDPC codeword size increases beyond approximately 4 kilobytes (kB).

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One aspect of the disclosure provides a data storage apparatus comprising a non-volatile memory array and a processor coupled to the non-volatile memory array. The processor is configured to: determine a plurality of dimensions for a code, the plurality of dimensions comprising a plurality of coprime numbers; generate distinct circulant rotation values based on at least a root of unity number and a prime number; assign a different one of the distinct circulant rotation values to each of a plurality of circulant locations defined within the plurality of dimensions to generate the code; and encode data using the code.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 2 illustrates a circulant square matrix for generating a multi-dimensional quasi-cyclic (QC) low-density parity-check (LDPC) code.

FIG. 13 (including FIGS. 13A and 13B) illustrates the recovery of unreadable data in a volume LDPC product code in accordance with various aspects of the disclosure

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Example Data Storage System

Figure 1:
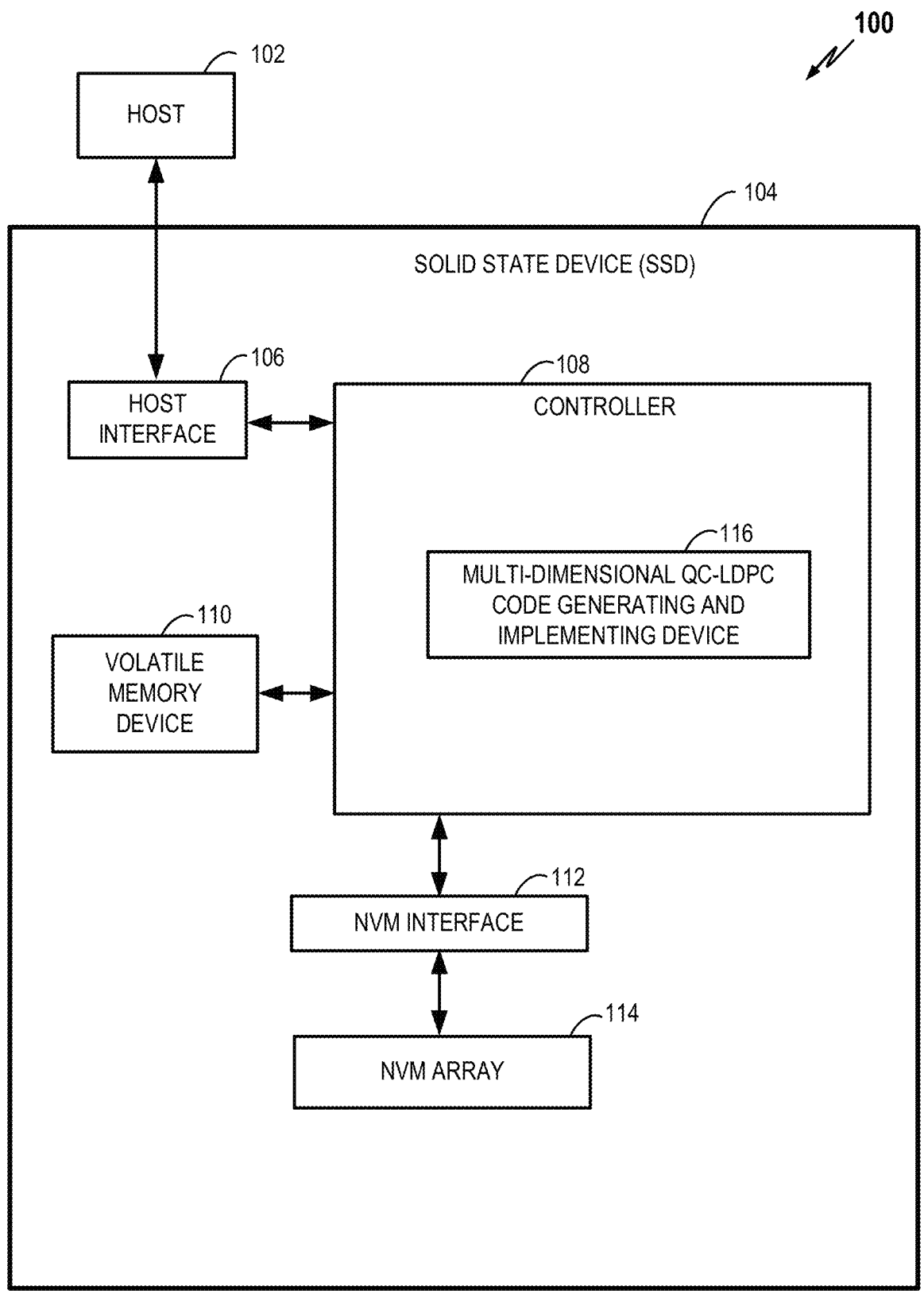
FIG. 1 illustrates an embodiment of a data storage system that includes a host device and a solid state device (SSD) communicatively coupled to the host device.

FIG. 1 illustrates an embodiment of a data storage system 100 that includes a host device 102 and a solid state device (SSD) 104 communicatively coupled to the host device 102. The host device (e.g., a host computer) 102 provides commands to the SSD 104 for transferring data between the host device 102 and the SSD 104. For example, the host device 102 may provide a write command to the SSD 104 for writing data to the SSD 104 or a read command to the SSD 104 for reading data from the SSD 104. The host device 102 may be any system or device having a need for data storage or retrieval and a compatible interface for communicating with the SSD 104. For example, the host device 102 may a computing device, a personal computer, a portable computer, or workstation, a server, a personal digital assistant, a digital camera, a digital phone, or the like.

The SSD 104 includes a host interface 106, a controller 108, an optional memory 110, and a non-volatile memory (NVM) 112. The host interface 106 is coupled to the controller 108 and facilitates communication between the host device 102 and the controller 108. Additionally, the controller 108 is coupled to the memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host device 102 includes the SSD 104 (e.g., the host device 102 and the SSD 104 are implemented as a single component). In other embodiments, the SSD 104 is remote with respect to the host device 102 or is contained in a remote computing system coupled in communication with the host device 102. For example, the host device 102 may communicate with the SSD 104 through a wireless communication link.

The controller 108 controls operation of the SSD 104. In various embodiments, the controller 108 receives commands from the host device 102 through the host interface 106 and performs the commands to transfer data between the host device 102 and the NVM 112. In addition, the controller 108 performs internal operations such as garbage collection operations, data integrity operations, and wear leveling operations. The controller 108 may include any type of processing device, such as a microprocessor, a microcontroller, an embedded controller, a logic circuit, software, firmware, or the like, for controlling operation of the SSD storage device 104.

In some embodiments, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. In some embodiments, one or more of the functions described herein as being performed by the controller 108 are instead performed by the host device 102. In some embodiments, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the memory 110, or a portion thereof, to store data during the transfer of data between the host device 102 and the NVM 112. For example, the memory 110 or a portion of the memory 110 may be a cache memory. In one aspect, the data storage system 100 is configured for use with the NVM Express (NVMe) system, where an NVM data storage controller (e.g., controller 108) is configured to control access to an NVM device (e.g., 114) such as a NAND storage device (hereinafter, "NAND") using NVMe protocols. The NVMe system is a scalable host controller interface for use with systems SSDs utilizing Peripheral Component Interconnect (PCI) Express (PCIe). See, e.g., NVM Express standard, Revision 1.3a, Oct. 24, 2017. However, as least some features described herein are applicable to other data storage devices, drives, systems or protocols.

The controller 108 includes a multi-dimensional quasi-cyclic (QC) low-density parity-check (LDPC) code generating device 116. Briefly, the multi-dimensional QC-LDPC code generating device 116 may determine a plurality of dimensions for a code, the plurality of dimensions comprising a plurality of coprime numbers, generate distinct circulant rotation values based on at least a root of unity number and a prime number, assign a different one of the distinct circulant rotation values to each of a plurality of circulant locations defined within the plurality of dimensions to generate the code, and encode data using the code.

Multi-Dimensional Low-Density Parity-Check Codes

In conventional one-dimensional quasi-cyclic (QC) low-density parity-check (LDPC) codes (also may be referred to as planar QC-LDPC codes), circulant matrices may be used to form a parity-check matrix H of a QC LDPC code. For example, with reference to FIG. 2, a circulant square matrix 200 for generating a QC LDPC code may have a size 202 (e.g., indicated as the variable M in FIG. 2) and may include substantially more zeros than ones. Accordingly, in FIG. 2, each of the shaded squares (e.g., square 204) of the circulant square matrix 200 represents a position that is assigned the value one, while each of the clear squares (e.g., square 206) represent a position that is assigned the value zero. Therefore, in the example circulant square matrix 200, it can be seen that the ones are arranged diagonally from corner-to-corner. As further shown in FIG. 2, a unique rotation R may be applied to the columns of the circulant matrix 200. For example, FIG. 2 shows the resulting circulant square matrix 250 after shifting each of the columns of the circulant square matrix 200 by the value R 254. In the exemplary configuration of FIG. 2, the value of R 254 is set to 10. However, the value of R 254 may be different in other aspects. It should be noted that the shaded square 204 of the circulant square matrix 200 corresponds to the shaded square 256 of the circulant square matrix 250. It should further be noted that a value in a column that is shifted beyond the last column of the circulant square matrix 250 may wrap around to the initial column of the circulant square matrix 250. Accordingly, for example, it should be understood that the shaded square 208 of the circulant square matrix 250 corresponds to the shaded square 258 of the circulant square matrix 250. In some applications, the conventional one-dimensional QC LDPC codes may produce a large number of short cycles which may significantly degrade the performance of the QC LDPC codes. In other applications, the guaranteed minimum distance ($D_{min}$) of the code produced by the conventional one-dimensional QC LDPC codes may not be sufficient.

Aspects of the present disclosure provide mathematical approaches for designing and implementing single and multi-dimensional LDPC codes. Multi-dimensional LDPC codes may also may be referred to as volume codes or product codes. Product codes may include a form of multi-dimensional coding typically seen, for example, in tape drives that implement Reed-Solomon codes in multiple dimensions. The LDPC codes may include single and multi-dimensional quasi-cyclic (QC) LDPC codes (e.g., two-dimensional QC LDPC codes), and may be used to encode data for storage in a data storage apparatus. Such a data storage apparatus may include the SSD 104, a solid state drive, a hard disk drive (HDD), a tape drive, or other suitable types of data storage apparatuses. The concise algebraic construction of the single and multi-dimensional QC LDPC codes described herein may provide a more efficient hardware implementation as compared to conventional one-dimensional QC LDPC codes. For example, techniques for constructing the conventional one-dimensional QC LDPC codes, such as progressive edge growth techniques, may involve the selection of random numbers using look up tables (LUTs). The use of these LUTs consume a significant amount of hardware resources, thereby reducing the efficiency of the hardware.

These single and multi-dimensional QC LDPC codes may significantly decrease the number of short cycles in the code and may increase the guaranteed minimum distance ($D_{min}$) of the code. In some aspects, the methods described herein may be used to generate multi-dimensional QC LDPC codes that prevent the occurrence of four cycles and six cycles in all decoding planes. Moreover, the single and multi-dimensional QC LDPC codes generated using the approaches disclosed herein may generally increase the efficiency of the code (e.g., by increasing corrected random errors for a given redundancy) and may enable coding options that may not be achieved using conventional approaches. In some aspects of the disclosure, and as described in greater detail below with reference to FIGS. 3 and 4, a new form of a circulant may be used to generate the single and multi-dimensional QC LDPC codes.

Figure 3B:
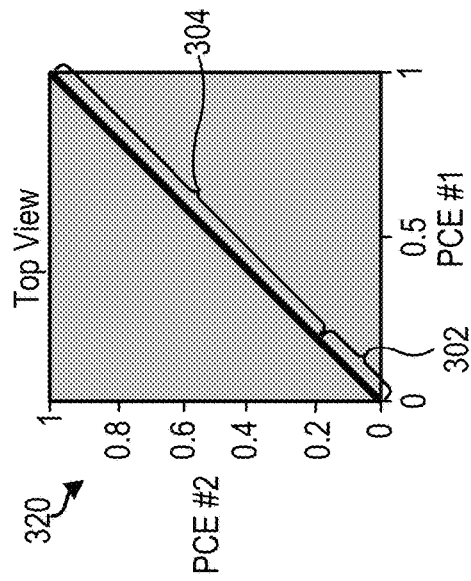
FIG. 3 (including FIGS. 3A through 3D) illustrates an example of a three-dimensional circulant cube in accordance with some aspects of the disclosure.
Figure 3D:
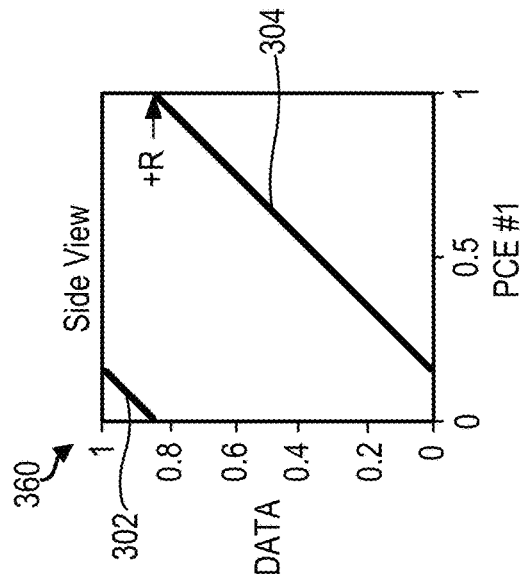
Figure 3A:
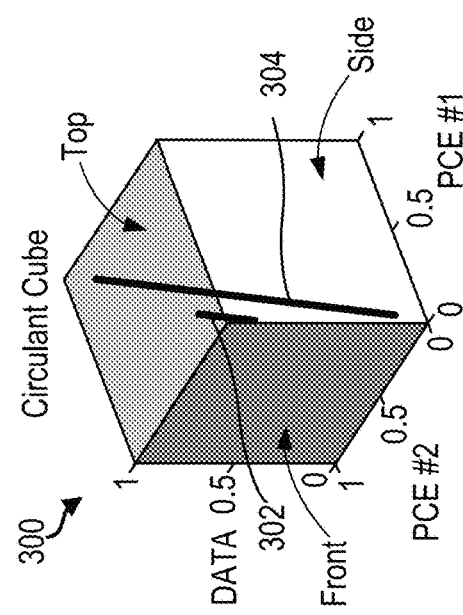
Figure 3C:
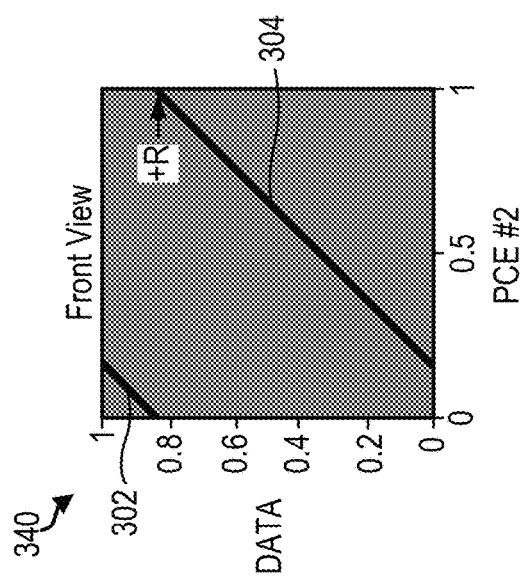
Figure 4A:
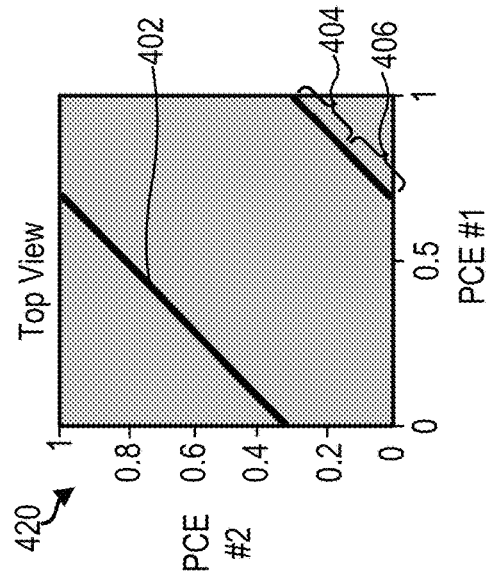
FIG. 4 (including FIGS. 4A through 4D) illustrates an example of a three-dimensional circulant cube in accordance with some aspects of the disclosure.
Figure 4B:
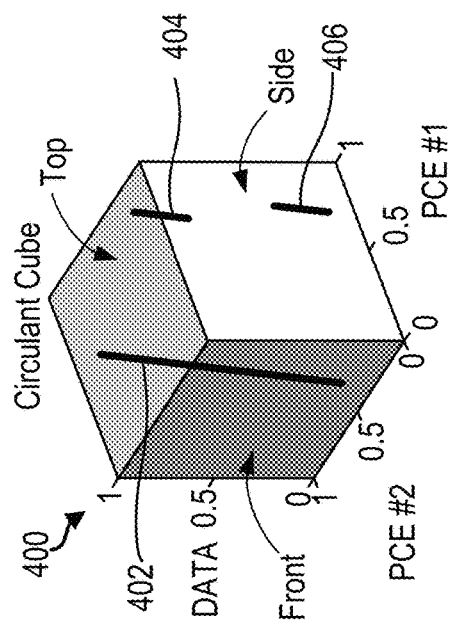
Figure 4C:
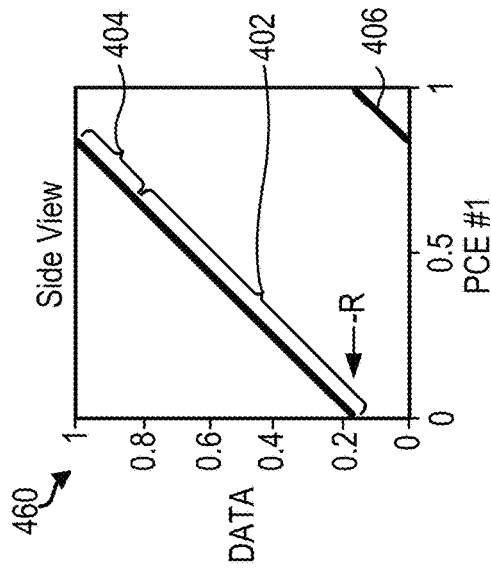
Figure 4D:
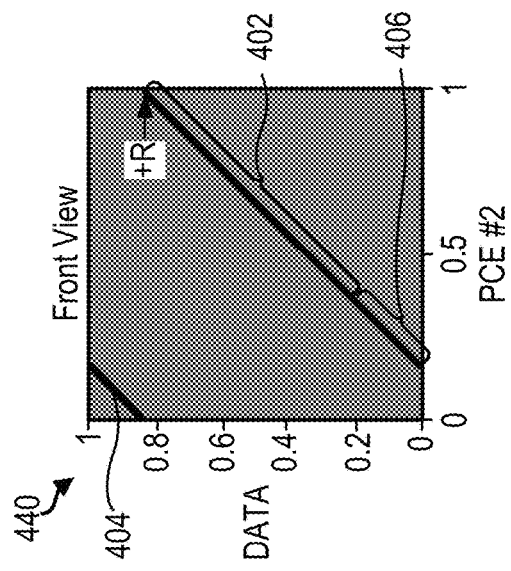

The new form of circulant may be represented as a three-dimensional circulant cube. FIG. 3 (including FIGS. 3A through 3D) illustrates an example of a three-dimensional circulant cube 300 in accordance with some aspects of the disclosure. As shown in FIG. 3A, each dimension of the circulant cube 300 may be configured to represent units of data, a first path computation element (PCE #1), and a second path computation element (PCE #2). The circulant cube 300 in FIG. 3A may include substantially more zeros than ones, with a single diagonal of ones that appears diagonal when viewed from any of the three side dimensions. For example, with reference to the circulant cube 300, the lines 302 and 304 represent a diagonal of ones. In this example, the single diagonal of ones appears diagonal when viewed from the top (e.g., the top view 320 shown in FIG. 3B), the front (e.g., the front view 340 shown in FIG. 3C), and the side (e.g., the side view 360 shown in FIG. 3D) of the circulant cube 300. As shown in the front view 340 in FIG. 3C and the side view 360 in FIG. 3D, a unique rotation R may be applied to the columns of the circulant cube 300. As shown in FIGS. 3C and 3D, the column rotation (e.g., denoted as "+R") is viewed positive from the front view 340 and the side view 360.

FIG. 4 (including FIGS. 4A through 4D) illustrates another example of a three-dimensional circulant cube 400 in accordance with some aspects of the disclosure. As shown in FIG. 4A, each dimension of the circulant cube 400 may be configured to represent units of data, a first path computation element (PCE #1), and a second path computation element (PCE #2). The circulant cube 400 in FIG. 4A may include substantially more zeros than ones, with a single diagonal of ones that appears diagonal when viewed from any of the three side dimensions. For example, with reference to the circulant cube 400, the lines 402, 404, and 406 represent a diagonal of ones. In this example, the single diagonal of ones appears diagonal when viewed from the top (e.g., the top view 420 shown in FIG. 4B), the front (e.g., the front view 440 shown in FIG. 4C), and the side (e.g., the side view 460 shown in FIG. 4D) of the circulant cube 400. As shown in the front view 440 in FIG. 4C and the side view 460 in FIG. 4D, a unique rotation R may be applied to the columns of the circulant cube 400. In the example of FIG. 4, the column rotation appears as a positive rotation (e.g., denoted as "+R") from the front view 440, and appears as a negative rotation (e.g., denoted as "−R") from the side view 360. Therefore, the column rotation may also be observed from the top view 420.

Construction of Multi-Dimensional Low-Density Parity-Check Codes

An example procedure for constructing a multi-dimensional QC-LDPC code (e.g., a two-dimensional LDPC code, a three-dimensional LDPC code) will now be described with reference to the exemplary operations 500 shown in FIG. 5. In some aspects of the disclosure, the operations 500 may be performed by the controller 108. At operation 502, the controller 108 may select a prime number M. At operation 504, the controller 108 may determine the prime factors of M−1 (also referred to as a prime factorization operation). In some aspects of the disclosure, the prime number M may represent the total number of elements in a finite group. For example, the prime number M may represent the total number of elements in the example set of elements $\{0, \alpha^0, \alpha^1, \alpha^2, \ldots, \alpha^{M-2}\}$ mod M. Accordingly, M−1 may represent the total number of nonzero elements in the example set of nonzero elements $\{\alpha^0, \alpha^1, \alpha^2, \ldots, \alpha^{M-2}\}$ mod M. The set of nonzero elements $\{\alpha^0, \alpha^1, \alpha^2, \ldots, \alpha^{M-2}\}$ mod M may define a group that satisfies the four group axioms including closure, associativity, identity and invertibility. It should be noted that a single element (e.g., u) may be used to generate the remaining nonzero elements in the set. In some aspects of the disclosure, all of the nonzero elements in the set $\{\alpha^0, \alpha^1, \alpha^2, \ldots, \alpha^{M-2}\}$ mod M must be coprime to one another. In other aspects of the disclosure, all of the nonzero elements in the set $\{\alpha^0, \alpha^1, \alpha^2, \ldots, \alpha^{M-2}\}$ mod M are not coprime to one another. In the aspects described herein, the set of nonzero elements $\{\alpha^0, \alpha^1, \alpha^2, \ldots, \alpha^{M-2}\}$ mod M are considered to have circular properties (also referred to as cyclic properties). In some aspects, the previously described prime number M may correspond to a size of a square circulant.

At operation 506, the controller 108 may allocate the prime factors of the value M−1 to form the desired dimensions of the code. In some aspects of the disclosure, the prime factors and combinations of the prime factors, such as a product of two or more of the prime factors, may be allocated to form the desired dimensions of the code. It should be noted that the dimensions of the code should be co-prime with respect to one another. At operation 508, the controller 108 may select a root of unity number that generates a finite set of unique values based on the expression ($\alpha^e$ mod M) for e=0 to (M−2), where $\alpha$ represents the root of unity number and M represents the previously described prime number.

At operation 510, the controller 108 may assign a circulant rotation to each circulant location (e.g., to each grid location) of the code. For example, in the case of a two-dimensional QC-LDPC code construction, the controller 108 may assign a circulant rotation to each circulant location according to equation 1:

$$C_{(e\ mod\ D_x, e\ mod\ D_y)} = \alpha^e\ mod\ M \quad \text{(equation 1)}$$

where $C_{(e\ mod\ D_x, e\ mod\ D_y)}$ represents the circulant location (e.g., at a grid location (e mod $D_x$, e mod $D_y$)), $\alpha^e$ mod M represents the circulant assigned to the circulant location, e represents an index value, M represents a prime number, $D_x$ represents a code dimension along the x axis, and $D_y$ represents a code a dimension along the y axis.

For example, in the case of a three-dimensional QC-LDPC code construction, for example, the controller 108 may assign a circulant rotation to each circulant location according to equation 2:

$$C_{(e\ mod\ D_x, e\ mod\ D_y, e\ mod\ D_z)} = \alpha^e\ mod\ M. \quad \text{(equation 2)}$$

where $C_{(e\ mod\ D_x, e\ mod\ D_y, e\ mod\ D_z)}$ represents the circulant location (e.g., at a grid location (e mod $D_x$, e mod $D_y$, e mod $D_z$)), $\alpha^e$ mod M represents the circulant assigned to the circulant location, e represents an index value, M represents a prime number, $D_x$ represents a code dimension along the x axis, $D_y$ represents a code a dimension along the y axis, and $D_z$ represents a code a dimension along the z axis.

An example construction of a two-dimensional QC-LDPC code will now be described in accordance with the operations 500 of FIG. 5. The controller 108 may generate a two-dimensional LDPC code (also referred to as a planar LDPC code) by selecting the prime number 1051 (e.g., M=1051) and performing a prime factorization of the number 1050 (e.g., M−1=1050). Therefore, in this example, the controller 108 may determine that the prime factors of the number 1050 are 2, 3, 5, 5, and 7 (e.g., 2×3×5×5×7=1050). The controller 108 may allocate the prime factors 2, 3, 5, 5, and 7 to form the desired dimensions of the code. For example, the controller 108 may allocate the product of the prime factors 2, 5, 5 and 7 to a first dimension $D_x$ (e.g., $D_x$=2×5×5×7=350) and may allocate the remaining prime factor 3 to a second dimension $D_y$ (e.g., $D_y$=3). In this example, the controller 108 may determine that the value of $\alpha$ is the number 3, since $3^e$ mod M for e=0 to e=(M−2) generates all unique element values. The controller 108 may assign a circulant rotation to each circulant location according to equation (3):

$$C_{x,y} = C_{(e\ mod\ D_x, e\ mod\ D_y)} = 3^e\ mod\ M. \quad \text{(equation 3)}$$

An example construction of a three-dimensional QC-LDPC code will now be described in accordance with the operations 500 of FIG. 5. The controller 108 may generate a three-dimensional LDPC code (also referred to as a volume LDPC code) by selecting the prime number 1327 (e.g., M=1327) and performing a prime factorization of the number 1326 (e.g., M−1=1326). Therefore, in this example, the controller 108 may determine that the prime factors of the number 1326 are 2, 3, 13, and 17 (e.g., 2×3×13×17=1326). The controller 108 may allocate the prime factors 2, 3, 13, and 17 to form the desired dimensions of the code. For example, the controller 108 may allocate the product of the prime factors 2 and 13 to a first dimension $D_x$ (e.g., $D_x$=2×13=26), the prime factor 17 to a second dimension $D_y$ (e.g., $D_y$=17), and the remaining prime factor 3 to a third dimension $D_z$ (e.g., $D_z$=3). In this example, the controller 108 may determine that the value of a is the number 3, since $3^e$ mod M for e=0 to e=(M−2) generates all unique element values. The controller 108 may assign a circulant rotation to each circulant location according to equation (4):

$$C_{x,y,z} = C_{(e\ mod\ D_x, e\ mod\ D_y, e\ mod\ D_z)} = 3^e\ mod\ M \quad \text{(equation 4)}$$

Figure 6:
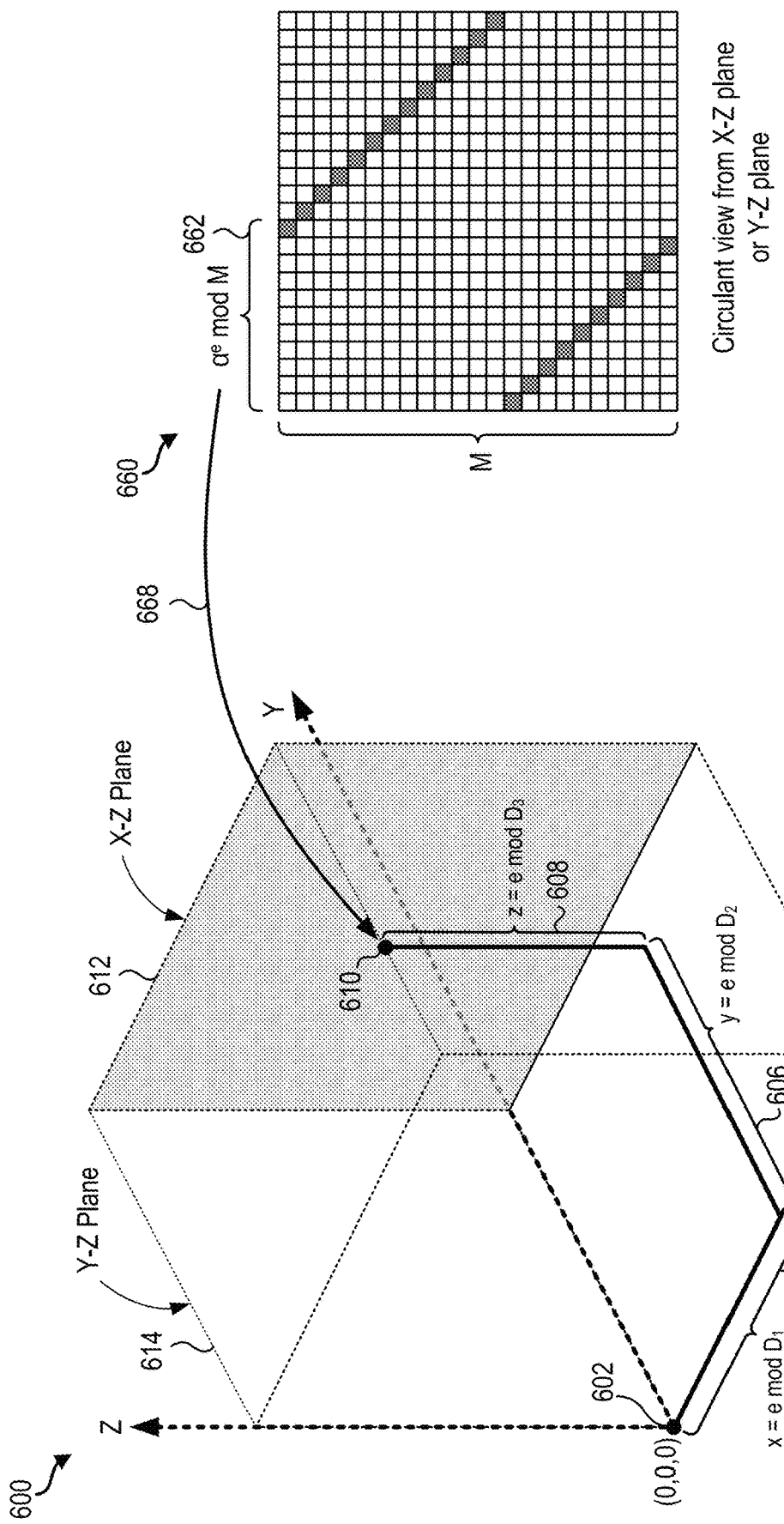
FIG. 6 illustrates an example of a circulant location in a circulant cube and a circulant assigned to the circulant location.

FIG. 6 illustrates an example of a circulant location 610 (also referred to as a grid location herein) in a circulant cube 600 and a circulant 662 assigned to the circulant location 610. As shown in FIG. 6, the circulant location 610 may be determined with respect to the origin 602 (e.g., indicated with the coordinates (0,0,0), such that x=0, y=0, z=0). For example, the x coordinate 604 of the circulant location 610 may be expressed as x=e mod $D_1$, the y coordinate 606 of the circulant location 610 may be expressed as y=e mod $D_2$, and the z coordinate 608 of the circulant location 610 may be expressed as z=e mod $D_3$. As further shown in FIG. 6, the circulant 662 (e.g., the value of the expression $\alpha^e$ mod M) may be assigned to the circulant location 610 as indicated with the arrow 668. As shown in FIG. 6, the circulant view 660 represents an example view of the circulant cube 600 from the X-Z plane 612 or the Y-Z plane 614.

Relationships Between Circulant Locations and a Linear Index

In some aspects of the disclosure, circulants may be assigned from a linear index (e.g., index e, where e may be a number from 0 to M−2) to circulant locations. An example relationship between a circulant (e.g., $\alpha^e$ mod M) corresponding to an index e and a circulant location $C_{x,y,z}$ is shown in equation (5):

$$C_{x,y,z} = C_{(e\ mod\ D_x, e\ mod\ D_y, e\ mod\ D_z)} = \alpha^e\ mod\ M \quad \text{(equation 5)}$$

In some aspects of the disclosure, the previously described linear index may be determined from a circulant location $C_{x,y,z}$. For example, given the coordinates x, y, and z, equations (6) to (9) may be used to determine a corresponding index value (e.g., index e):

$$S_x = (D_y)(D_z) \times [(D_y)(D_z)]^{-1}\ mod\ D_x]\ mod(M-1) \quad \text{(equation 6)}$$

$$S_y = (D_x)(D_z) \times [(D_x)(D_z)]^{-1}\ mod\ D_y]\ mod(M-1) \quad \text{(equation 7)}$$

$$S_z = (D_x)(D_y) \times [(D_x)(D_y)]^{-1}\ mod\ D_z]\ mod(M-1) \quad \text{(equation 8)}$$

$$e = (x)(S_x) + (y)(S_y) + (z)(S_z) \quad \text{(equation 9)}$$

where the term $S_x$ represents an intermediate computation value (e.g., a scaling value) for the x coordinate, the term $S_y$ represents an intermediate computation value (e.g., a scaling value) for the y coordinate, the term $S_z$ represents an intermediate computation value (e.g., a scaling value) for the z coordinate, and e is the value of the index. In some aspects of the disclosure, each of the equations (6), (7) and (8) may be determined using an Extended Euclidean algorithm.

Figure 7:
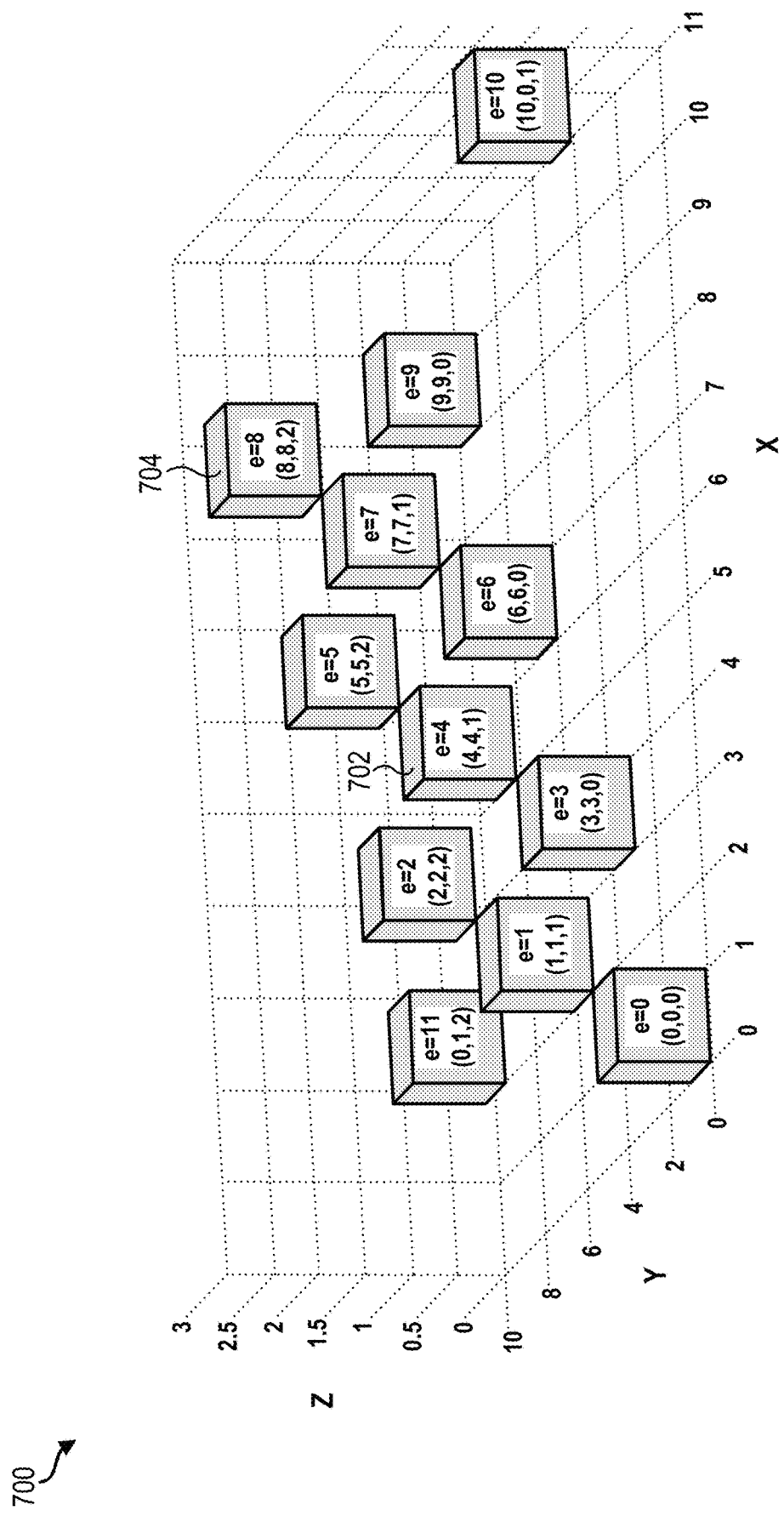
FIG. 7 illustrates an examplary three-dimensional mapping between circulant locations and their corresponding linear indexes in accordance with various aspects of the disclosure.

FIG. 7 illustrates an examplary three-dimensional mapping 700 between circulant locations and their corresponding linear indexes in accordance with various aspects of the disclosure. It should be noted that the exemplary configuration of FIG. 7 is generated based on the prime number 331 (e.g., M=331) and has the code dimensions $D_x$=11, $D_y$=10, and $D_z$=3. These code dimensions may be obtained using the procedures described herein (e.g., the exemplary operations 500 shown in FIG. 5). It should be understood that in other examples, a different prime number and/or code dimensions may be implemented. For example, with reference to FIG. 7, a circulant corresponding to index 4 (e.g., index e, where e=4) may be assigned to the circulant location 702 (e.g., where x=4, y=4, z=1), and a circulant corresponding to index 8 (e.g., index e, where e=8) may be assigned to the circulant location 704 (e.g., where x=8, y=8, z=2).

Figure 8:
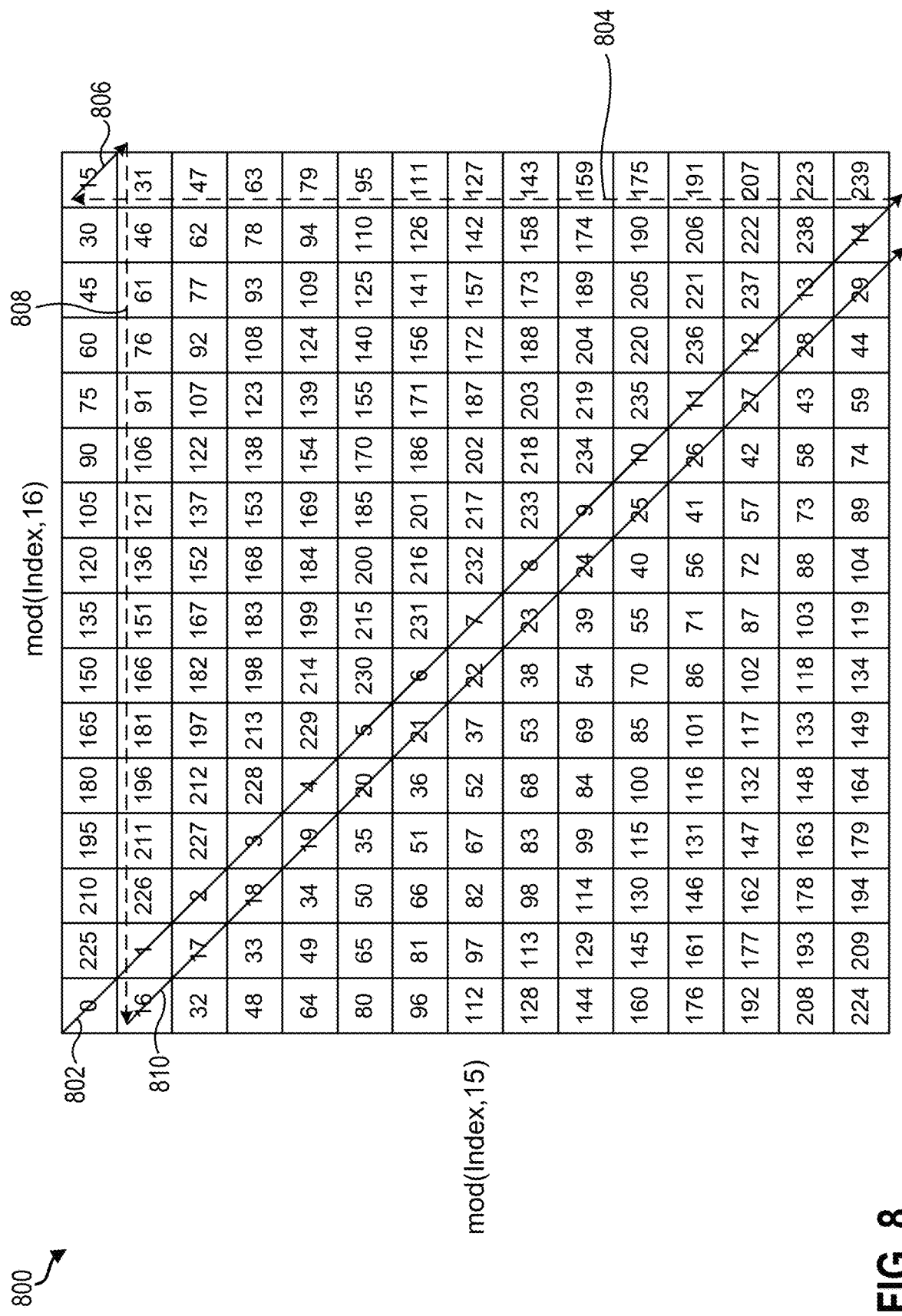
FIG. 8 illustrates a two-dimensional circular code construction in accordance with various aspects of the disclosure.

FIG. 8 illustrates a two-dimensional circular code construction 800 in accordance with various aspects of the disclosure. It should be noted that the exemplary configuration of FIG. 8 is generated based on the prime number 241 (e.g., M=241) and has the code dimensions $D_x$=16 and $D_y$=15. These code dimensions may be obtained using the procedures described herein. The two-dimensional circular code construction 800 may be expressed in mathematical form based on equation (10):

$$\text{Grid}(\text{mod}(x,16)+1,\text{mod}(x,15)+1)=x \quad \text{(equation 10)}$$

where x={0, 1, 2 . . . , 239}. As shown in FIG. 8, the circular characteristics of the circular code construction 800 may be observed following the sequence of numbers along the diagonal arrow 802 (e.g., the sequence of numbers 0 to 14). Upon reaching the final row of the circular code construction 800 along the arrow 802, the sequence of numbers continues beginning at the first row of the subsequent column (as indicated with the arrow 804). For example, the sequence of numbers continues along the diagonal arrow 806 (e.g., at the number 15). Upon reaching the final column of the circular code construction 800 along the diagonal arrow 806, the sequence of numbers continues beginning at the first column of the subsequent row (as indicated with the arrow 808). For example, the sequence of numbers continues along the diagonal arrow 810 (e.g., the sequence of numbers 16 to 29). Continuing in this way, the entire sequence (e.g., the sequence of numbers 0 to 239) of the two-dimensional circular code construction 800 may be traversed in a single pass such that no number of the sequence 0 to 239 is traversed more than once.

An example data encoding procedure for generating a volume LDPC product code will now be described with reference to FIGS. 9-12. The volume LDPC product code may also be referred to as a three-dimensional LDPC code or a three-dimensional QC-LDPC code. In this example, the volume LDPC product code is constructed based on the prime number 331 (e.g., M=331) and may have the code dimensions $D_x$=11, $D_y$=10, and $D_z$=3. It should be understood that in other examples, the volume LDPC product code discussed with reference to FIGS. 9-12 may be constructed with a different prime number and may have different code dimensions.

Figure 9C:
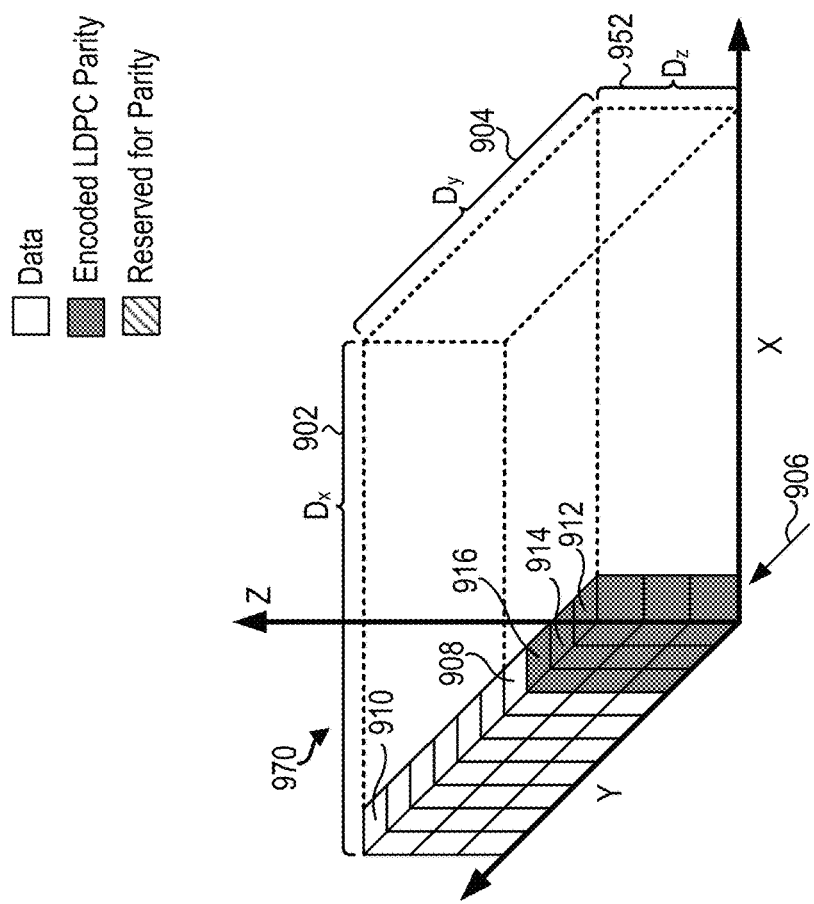
FIG. 9 (including FIGS. 9A to 9C) illustrates an example data encoding procedure for generating a volume LDPC product code in accordance with various aspects of the disclosure.
Figure 9A:
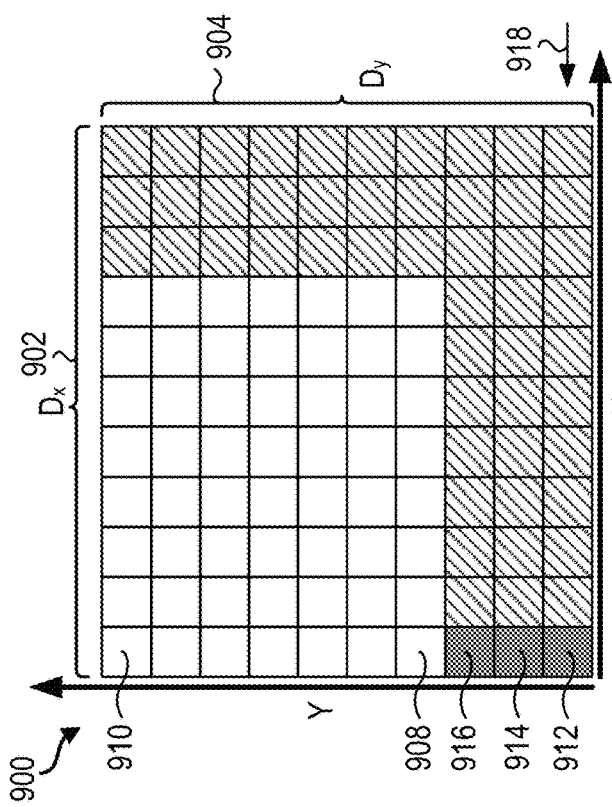
Figure 9B:
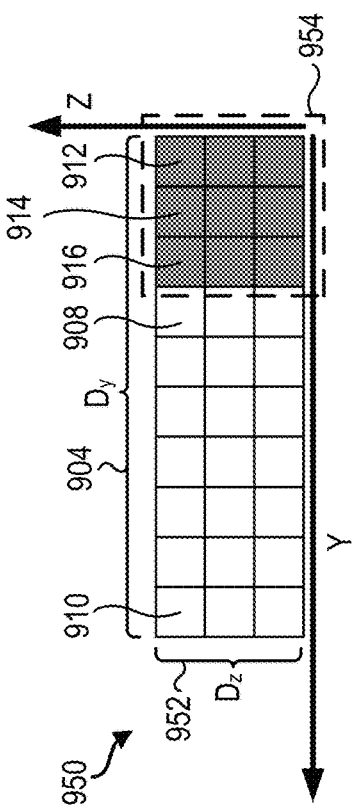

FIG. 9A shows a top view 900 of the code space for the volume LDPC product code. For example, as shown in FIG. 9, the top view 900 may represent the x-y plane of the volume LDPC product code. In this example, the x dimension 902 (e.g., also referred to as $D_x$) of the x-y plane may be expressed as $D_x$=11. The y dimension 904 (e.g., also referred to as $D_y$) of the x-y plane may be expressed as $D_y$=10. Accordingly, the top view 900 includes 11 columns (e.g., including the first column 906) and 10 rows (e.g., including the first row 918). A first portion of the blocks in FIG. 9A, such as block 910, may represent data of the volume LDPC product code and a second portion of the blocks (e.g., the blocks including hatching lines) may be reserved for LDPC parity information. Each column in FIG. 9A may be viewed as a 2D-LDPC. For example, the side view 950 of the first column 906 in FIG. 9B shows the two dimensions of the 2D-LDPC in the y-z plane of the code space for the volume LDPC product code. Therefore, in this example, the z dimension 952 (e.g., also referred to as $D_z$) of the y-z plane may be expressed as $D_z$=3. Accordingly, the side view 950 includes 3 rows with respect to the z axis.

The controller 108 may encode the first column 906 in FIG. 9A (e.g., which as previously discussed may be viewed as a 2D-LDPC with dimensions $D_z$=3 and $D_y$=10 in the y-z plane) to generate 3×3 circulants 954 of LDPC parity. As a reference, it should be noted that the circulants 912, 914, and 916 in FIG. 9B are the same circulants 912, 914, 916 in FIG. 9A in the top view 900. Moreover, the blocks 908 and 910 in FIG. 9B representing data of the volume LDPC product code are the same blocks 908 and 910 in FIG. 9A. A three-dimensional view 970 of the encoded first column 906 in the volume LDPC product code is shown in FIG. 9C.

Figure 10:
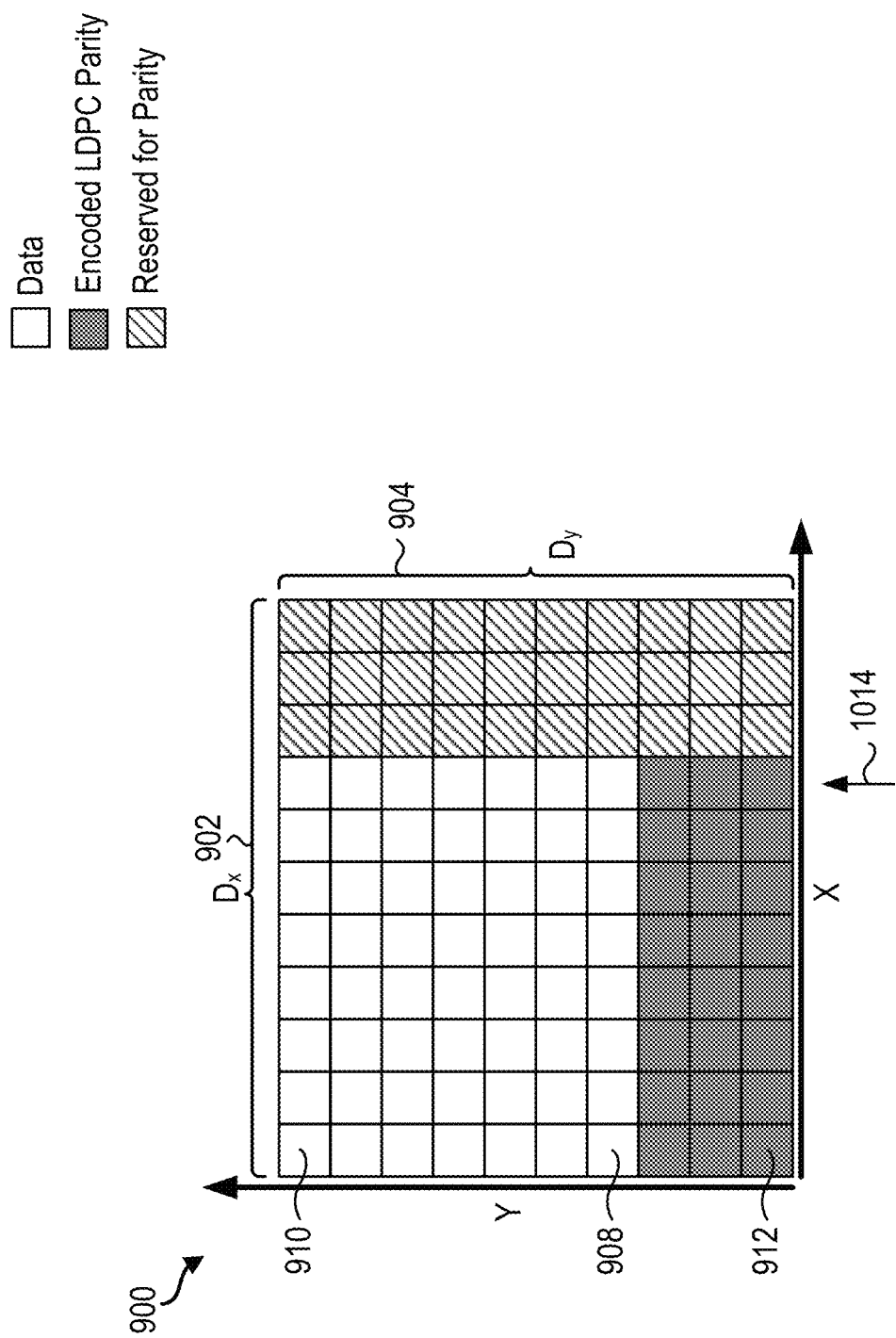
FIG. 10 illustrates an example data encoding procedure for generating a volume LDPC product code in accordance with various aspects of the disclosure.

The controller 108 may encode the remaining columns shown in FIG. 9A (e.g., up to the eighth column) using the approach described for the first column 906. FIG. 10 shows the top view 900 of the previously described code space for the volume LDPC product code after the remaining columns have been encoded.

Figure 11C:
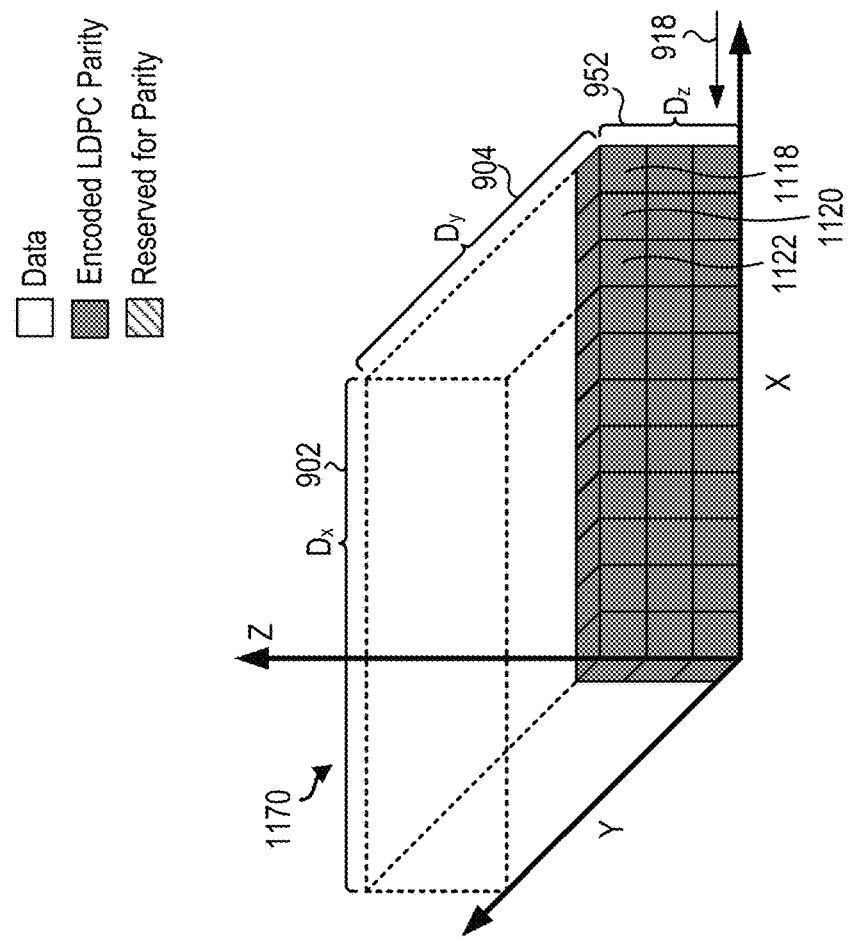
FIG. 11 (including FIGS. 11A to 11C) illustrates an example data encoding procedure for generating a volume LDPC product code in accordance with various aspects of the disclosure.
Figure 11A:
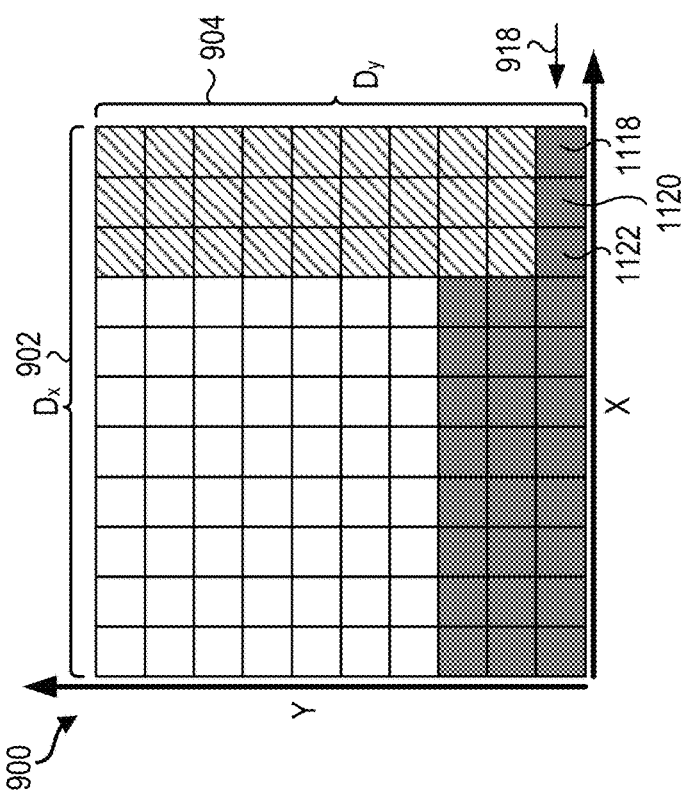
Figure 11B:
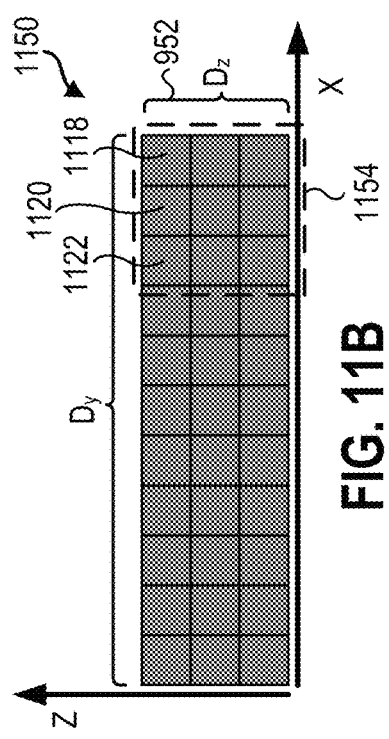

Referring now to the top view 900 in FIG. 11A, the controller 108 may proceed to encode the first row 918. Each row in FIG. 11A may be viewed as a 2D-LDPC. For example, the side view 1150 of the first row 918 in FIG. 11A shows the two dimensions of the 2D-LDPC in the x-z plane of the of the code space for the volume LDPC product code. Therefore, in this example, the z dimension 952 (e.g., also referred to as $D_z$) of the x-z plane may be expressed as $D_z$=3. Accordingly, the side view 1150 includes 3 rows with respect to the z axis. Therefore, the controller 108 may encode the first row 918 in FIG. 11A (e.g., which as previously discussed may be viewed as a 2D-LDPC with dimensions $D_z$=3 and $D_x$=11 in the x-z plane) to generate 3×3 circulants 1154 of LDPC parity. As a reference, it should be noted that the circulants 1118, 1120, and 1122 in FIG. 11B are the same circulants 1118, 1120, and 1122 in FIG. 11A in the top view 900. A three-dimensional view 1170 of the encoded first row 918 in the code space for the volume LDPC product code is shown in FIG. 11C.

Figure 12:
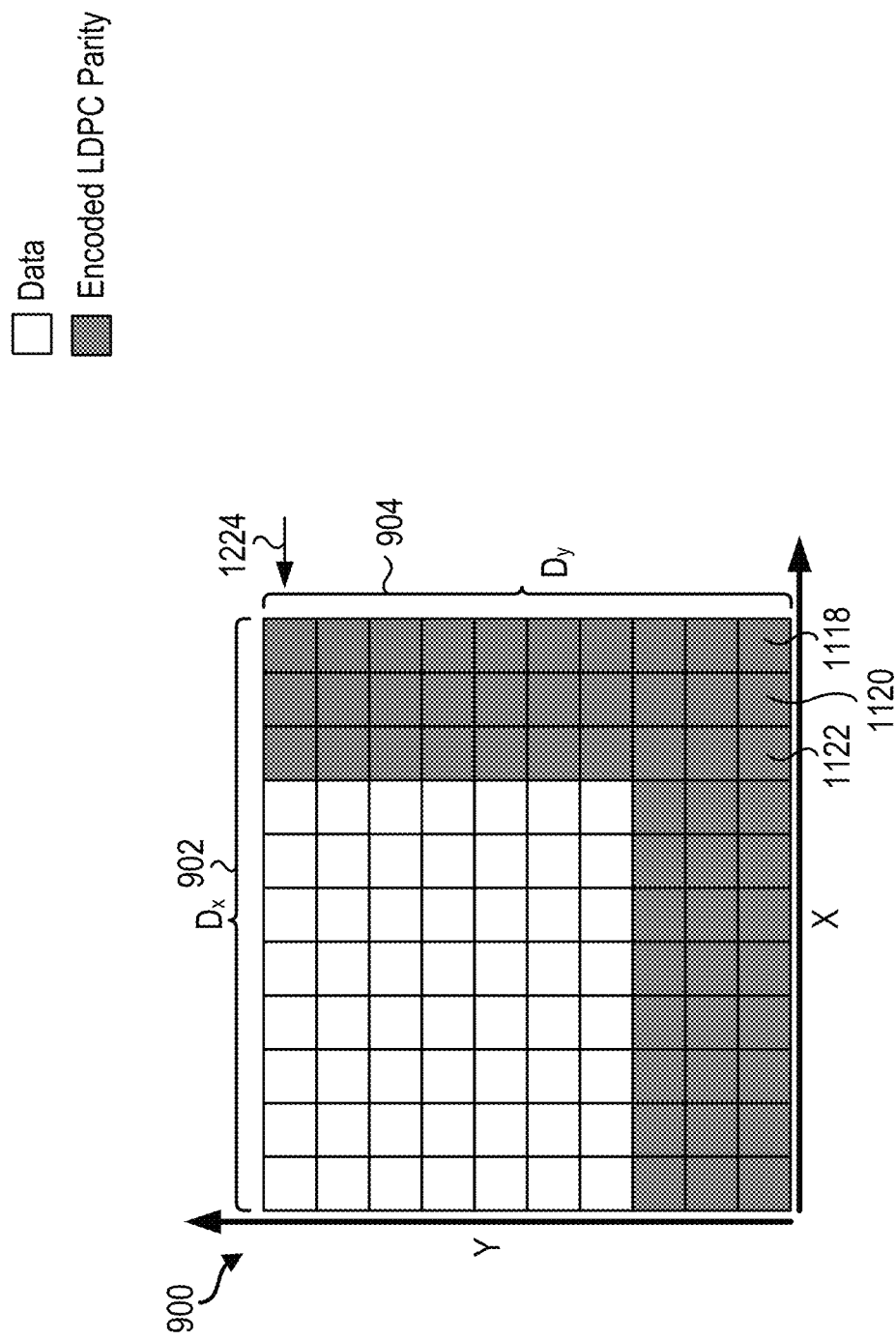
FIG. 12 illustrates an example data encoding procedure for generating a volume LDPC product code in accordance with various aspects of the disclosure.

The controller 108 may encode the remaining rows shown in FIG. 11A using the approach described for the first row 918. FIG. 12 shows the top view 900 of the previously described code space for the volume LDPC product code after the remaining rows (e.g., up to the tenth row 1224) have been encoded. Therefore, since the resulting volume LDPC product code has valid encoding along all x-z and y-z dimensions, the volume LDPC product code may provide more robust data recovery in situations where data cannot be read from a storage media.

For example, with reference to the top view 1300 of a volume LDPC product code shown in FIG. 13A, a portion of the data in the volume LDPC product code (e.g., the portion 1326) may no longer be readable by the controller 108. The data may be unreadable, for example, due to damage or defects in the storage media that stores the volume LDPC product code. In the example of FIG. 13A, it should be noted that the portion 1326 including the unreadable data is situated along row 1330 of the volume LDPC product code. As shown in FIG. 13B, the data orientation (also referred to as the direction of data flow) in the volume LDPC product code may be from right to left (e.g., beginning at arrow 1346) along each reach row. Therefore, if the amount of readable data in row 1330 is not sufficient to recover the unreadable data using the LDPC parity (e.g., blocks 1340, 1342, 1344) for row 1330, the controller 108 may experience a decoding failure. However, because the volume LDPC product code also includes parity information for each column, and because the amount of readable data in each column may be sufficient to recover the unreadable data using the LDPC parity for each column, the controller 108 may be able to recover the unreadable data. For example, with respect to column 1332, the controller 108 may recover the unreadable data in block 1328 by using the data in column 1332 and the LDPC parity in blocks 1334, 1336, 1338. Accordingly, the remaining unreadable data in portion 1326 may be recovered by using the data and LDPC parity in each corresponding column.

Figure 14:
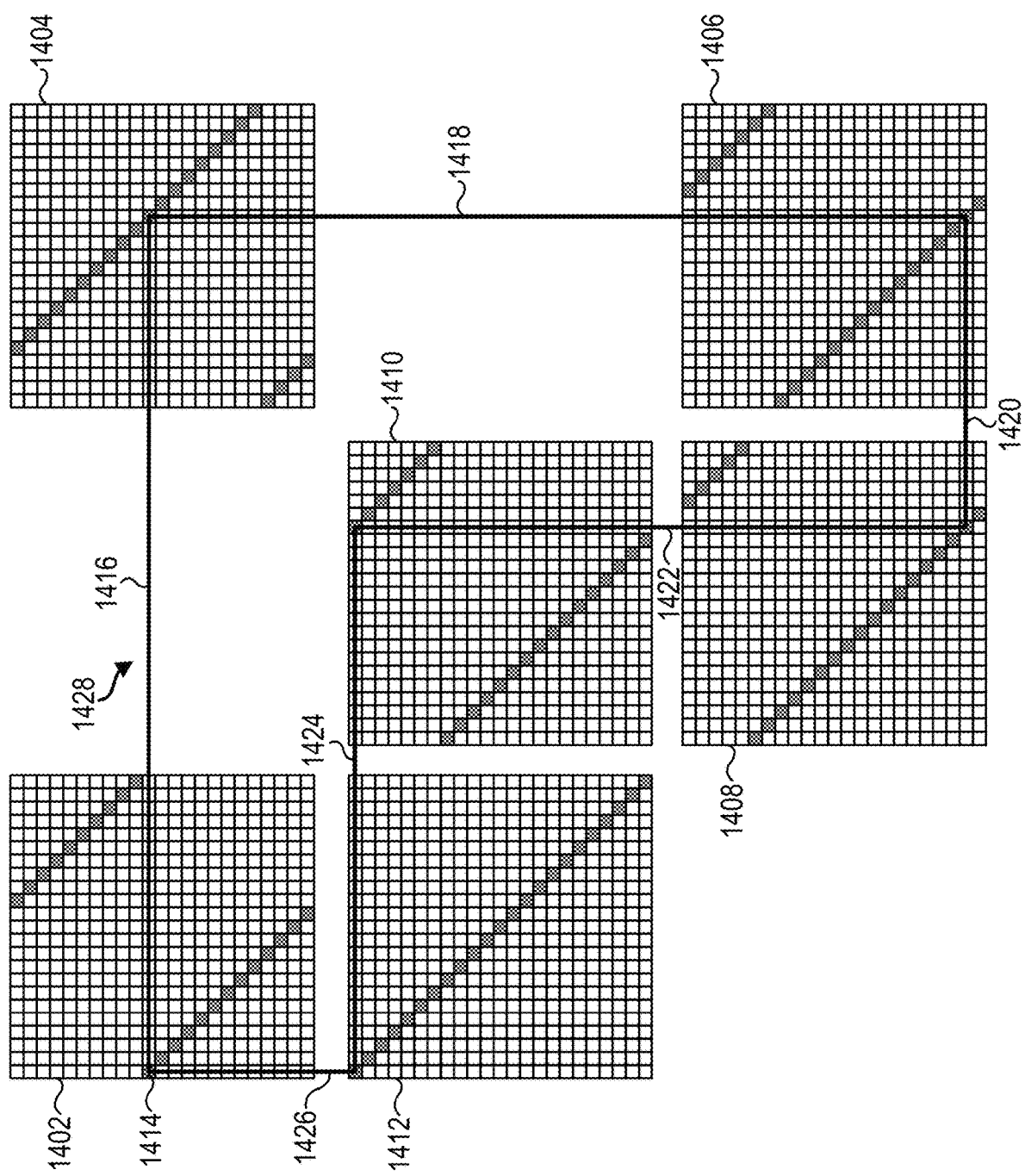
FIG. 14 illustrates a set of exemplary circulants of a QC-LDPC code, where each of the exemplary circulants is assigned a distinct circulant rotation

Quasi-cyclic code cycles may be analyzed using modulo arithmetic of the circulant rotations described herein, using the number of message passing steps in a cycle, and/or using loop analysis. FIG. 14 illustrates a set of exemplary circulants 1402, 1404, 1406, 1408, 1410, and 1412 of a QC-LDPC code, where each of the exemplary circulants 1402, 1404, 1406, 1408, 1410, and 1412 is assigned a distinct circulant rotation. As further shown in FIG. 14, a cycle of the QC-LDPC code is represented as the loop 1428 (e.g., beginning and ending at the shaded square 1414, where the shaded square 1414 represents a one in the circulant 1402). In the example configuration of FIG. 14, the loop 1428 includes the segments 1416, 1418, 1420, 1422, 1424, and 1426. The horizontal segments 1416, 1420, and 1424 may represent message passing steps. Cycles in a QC-LDPC code may occur when the sum of the circulants is equal to 0 mod M. As an example, short cycles may occur if two circulants sum to 0 mod M (e.g., $\alpha^0 + \alpha^{(M-1)/2} = 0$ mod M (along with all shifts)). As another example, short cycles may occur if three circulants sum to 0 mod M (e.g., $\alpha^0 + \alpha^x + (M - \alpha^0 - \alpha^x) = 0$ mod M (along with all shifts)). The number of short cycles occurring in a QC-LDPC code may serve as a metric for gauging the performance of a QC-LDPC code. For example, an increasing number of short cycles may degrade performance while a decreasing number of short cycles may improve performance.

Figure 15:
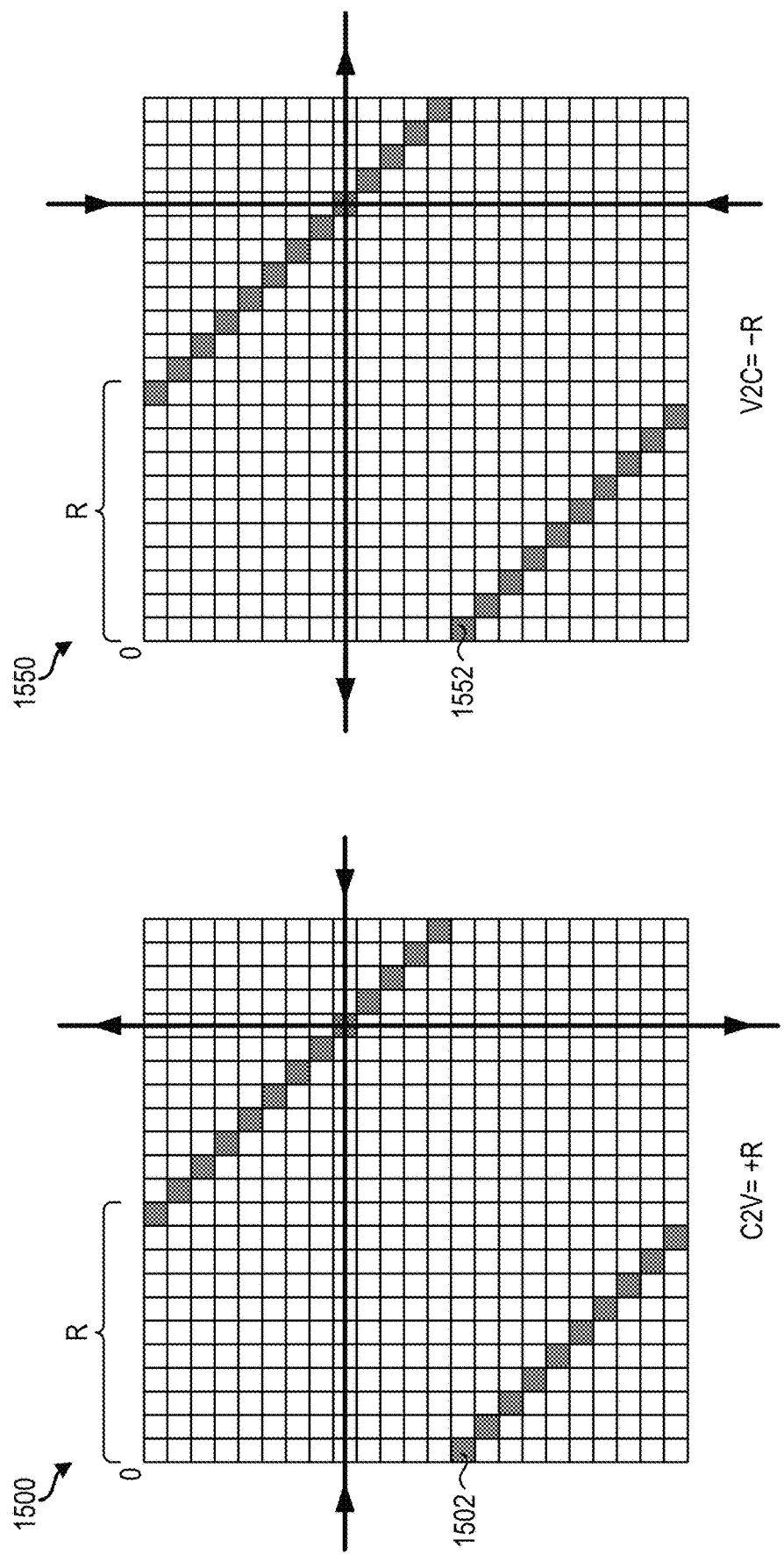
FIG. 15 illustrates exemplary circulants in accordance with various aspects of the disclosure.

FIG. 15 illustrates exemplary circulants 1500 and 1550 in accordance with various aspects of the disclosure. In the circulant 1500, the assigned circulant rotation R may be considered a positive rotation (indicated as "+R" in FIG. 15) of the diagonal one values, which are represented as the shaded squares (e.g., shaded square 1502) in the circulant 1500. In the example circulant 1550, the assigned circulant rotation R may be considered a negative rotation (indicated as "−R" in FIG. 15) of the diagonal one values, which are represented as the shaded squares (e.g., shaded square 1552) in the circulant 1550.

Figure 5:
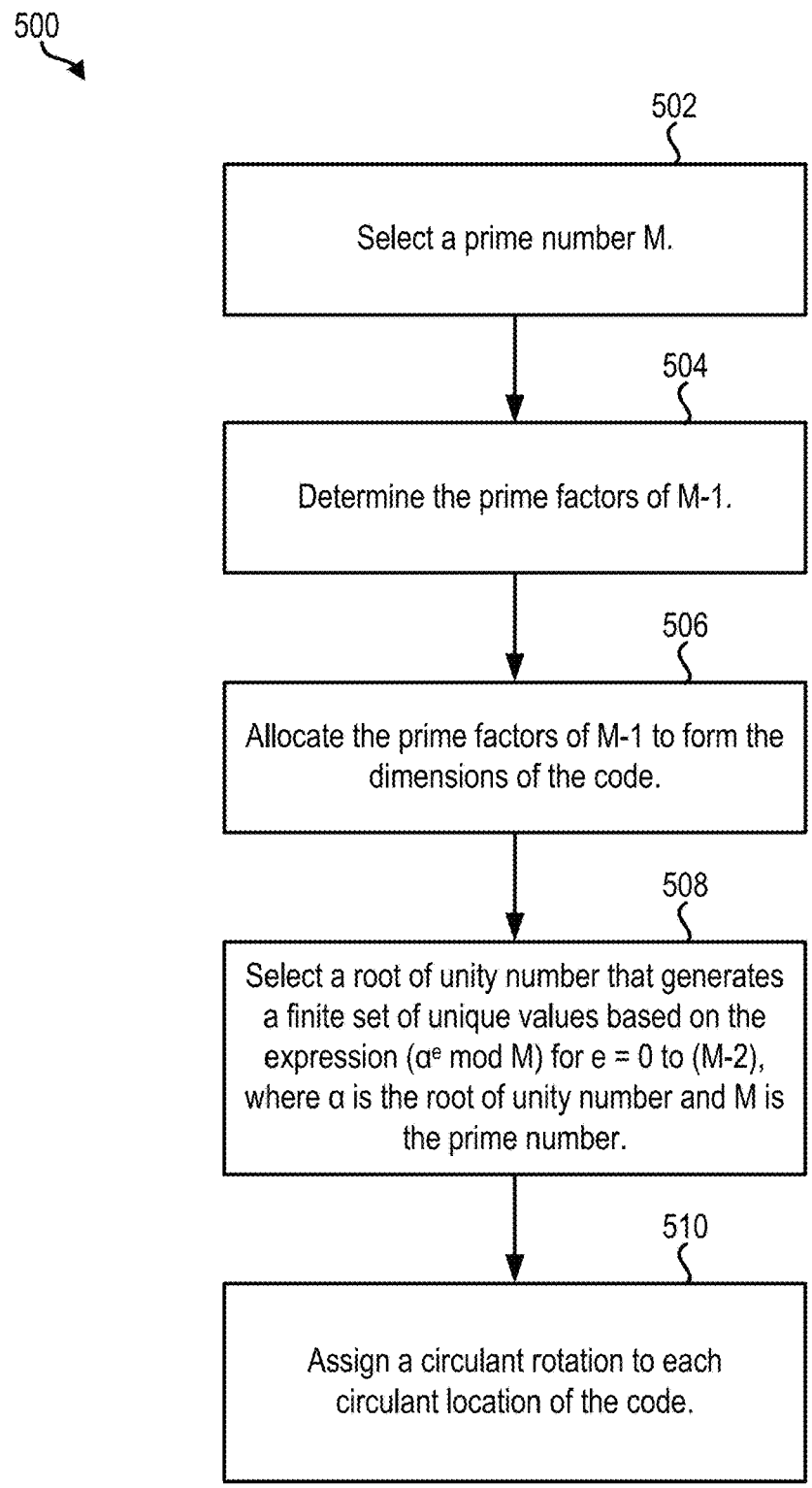
FIG. 5 illustrates an example procedure for constructing a multi-dimensional QC-LDPC code.
Figure 16:
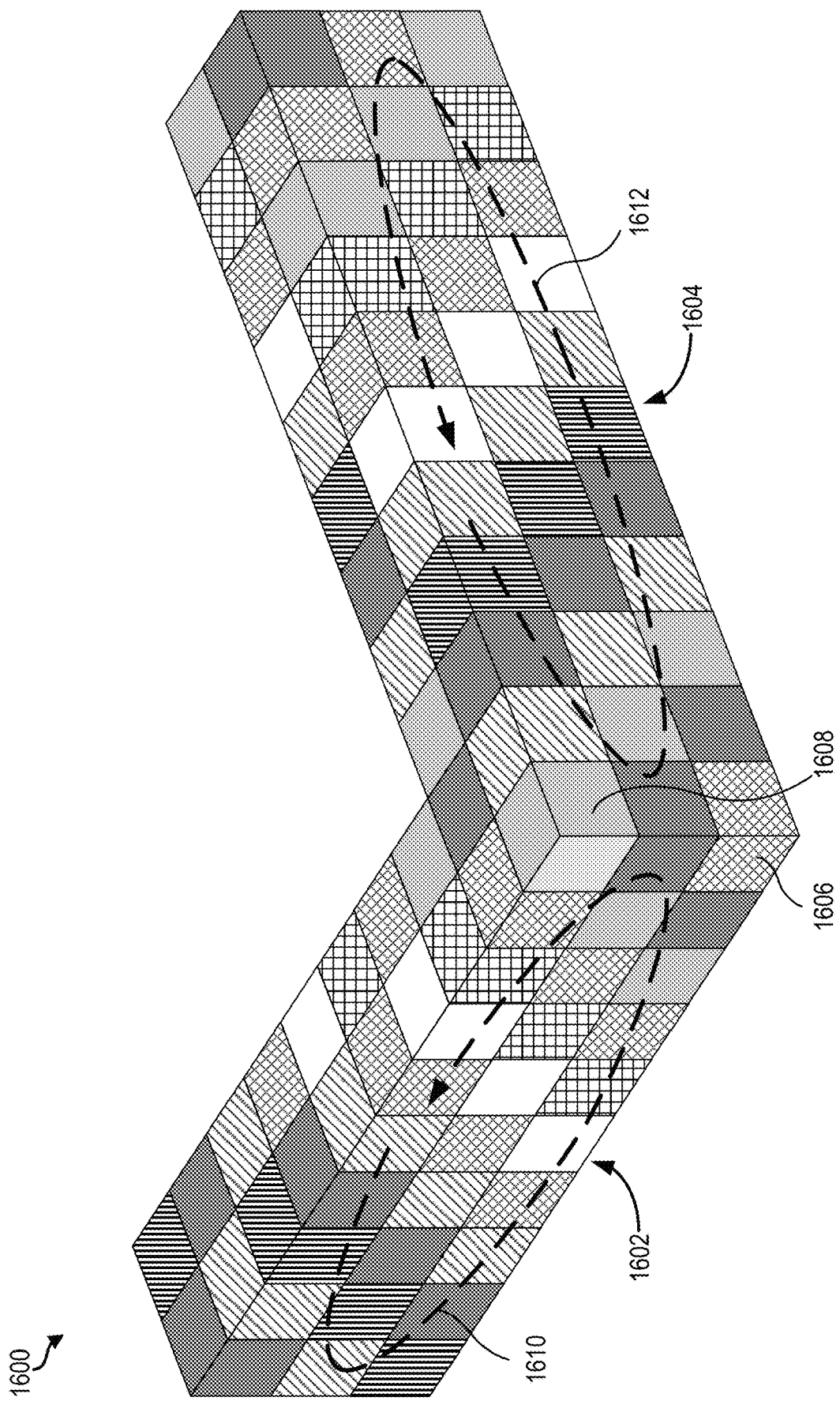
FIG. 16 illustrates a graphical representation of an examplary three-dimensional QC-LDPC code that may be generated using the procedures described herein.

FIG. 16 illustrates a graphical representation of an exemplary three dimensional QC-LDPC code 1600 that may be generated using the procedures described herein (e.g., the exemplary operations 500 shown in FIG. 5). For example, the three dimensional QC-LDPC code 1600 may be considered to be a mapping between circulant locations and their assigned circulant rotations. In FIG. 16, for example, each cube (e.g., cube 1606, 1608) may represent a circulant location and each type of shading or pattern of the cube may represent a unique circulant rotation. As shown in FIG. 16, the cubes may form a number of planes, such as the first plane 1602 and the second plane 1604, where each plane has circular properties as indicated with the dashed arrows 1610 and 1612. For example, the circular properties of the the cubes forming the first plane 1602 may allow shifting of the cubes (e.g., a permutation with respect to a row or column of cubes) in a direction along the first plane 1602 and having adjacent cubes make a corresponding shift.

Example Apparatus

Figure 17:
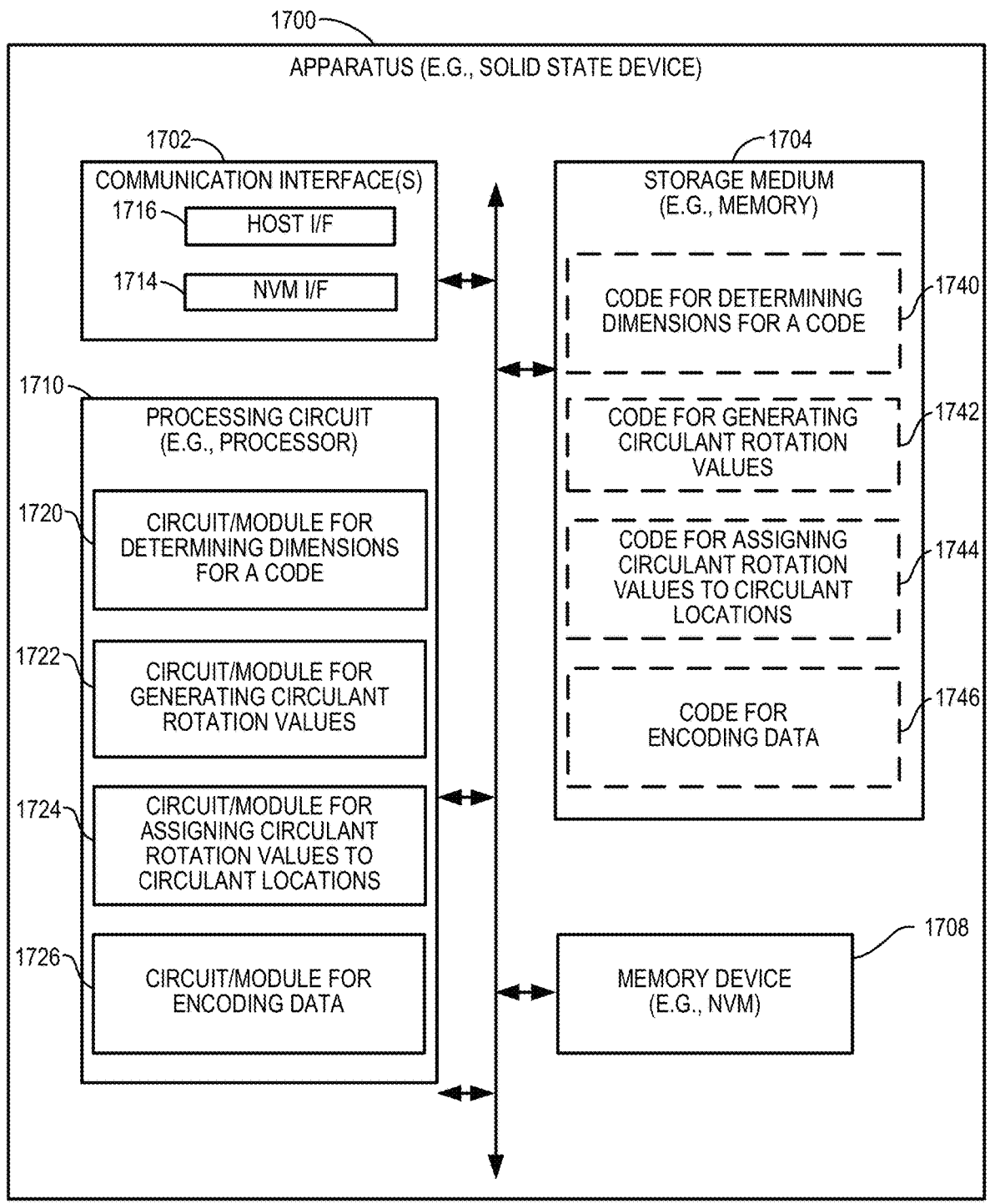
FIG. 17 illustrates an embodiment of an apparatus configured to communicate according to one or more aspects of the disclosure.

FIG. 17 illustrates an embodiment of an apparatus 1700 configured to communicate according to one or more aspects of the disclosure. The apparatus 1700 could embody or be implemented within a controller, an SSD, a solid state drive, a host device, an NVM device, a NAND die, or some other type of device that supports data storage. In various implementations, the apparatus 1700 could embody or be implemented within a computing device, a personal computer, a portable device, or workstation, a server, a personal digital assistant, a digital camera, a digital phone, an entertainment device, a medical device, or any other electronic device that stores data.

The apparatus 1700 includes a communication interface 1702, a storage medium 1704, a memory device (e.g., an NVM memory circuit) 1708, and a processing circuit 1610 (e.g., at least one processor and/or other suitable circuitry). These components can be coupled to and/or placed in electrical communication with one another via a signaling bus or other suitable component, represented generally by the connection lines in FIG. 17. The signaling bus may include any number of interconnecting buses and bridges depending on the specific application of the processing circuit 1710 and the overall design constraints. The signaling bus links together various circuits such that each of the communication interface 1702, the storage medium 1704, and the memory device 1708 are coupled to and/or in electrical communication with the processing circuit 1710. The signaling bus may also link various other circuits (not shown) such as timing sources, peripherals, voltage regulators, and power management circuits, which are well known in the art, and therefore, will not be described any further.

The communication interface 1702 provides a means for communicating with other apparatuses over a transmission medium. In some implementations, the communication interface 1702 includes circuitry and/or programming (e.g., a program) adapted to facilitate the communication of information bi-directionally with respect to one or more devices in a system. In some implementations, the communication interface 1702 may be configured for wire-based communication. For example, the communication interface 1702 could be a bus interface, a send/receive interface, or some other type of signal interface including drivers, buffers, or other circuitry for outputting and/or obtaining signals (e.g., outputting signal from and/or receiving signals into an integrated circuit). The communication interface 1702 serves as one example of a means for receiving and/or a means for transmitting.

The memory device 1708 may represent one or more memory devices. As indicated, the memory device 1708 may maintain mapping information 1718 along with other information used by the apparatus 1700. In some implementations, the memory device 1608 and the storage medium 1704 are implemented as a common memory component. The memory device 1708 may also be used for storing data that is manipulated by the processing circuit 1710 or some other component of the apparatus 1700.

The storage medium 1704 may represent one or more computer-readable, machine-readable, and/or processor-readable devices for storing programming, such as processor executable code or instructions (e.g., software, firmware), electronic data, databases, or other digital information. The storage medium 1704 may also be used for storing data that is manipulated by the processing circuit 1710 when executing programming. The storage medium 1704 may be any available media that can be accessed by a general purpose or special purpose processor, including portable or fixed storage devices, optical storage devices, and various other mediums capable of storing, containing or carrying programming.

By way of example and not limitation, the storage medium 1704 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1704 may be embodied in an article of manufacture (e.g., a computer program product). By way of example, a computer program product may include a computer-readable medium in packaging materials. In view of the above, in some implementations, the storage medium 1704 may be a non-transitory (e.g., tangible) storage medium. For example, the storage medium 1704 may be a non-transitory computer-readable medium storing computer-executable code, including code to perform operations as described herein.

The storage medium 1704 may be coupled to the processing circuit 1710 such that the processing circuit 1710 can read information from, and write information to, the storage medium 1704. That is, the storage medium 1704 can be coupled to the processing circuit 1710 so that the storage medium 1704 is at least accessible by the processing circuit 1710, including examples where at least one storage medium is integral to the processing circuit 1710 and/or examples where at least one storage medium is separate from the processing circuit 1710 (e.g., resident in the apparatus 1700, external to the apparatus 1700, distributed across multiple entities, etc.).

Programming stored by the storage medium 1704, when executed by the processing circuit 1710, causes the processing circuit 1710 to perform one or more of the various functions and/or process operations described herein. For example, the storage medium 1704 may include operations configured for regulating operations at one or more hardware blocks of the processing circuit 1710, as well as to utilize the communication interface 1702 for wireless communication utilizing their respective communication protocols.

The processing circuit 1710 is generally adapted for processing, including the execution of such programming stored on the storage medium 1704. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1710 is arranged to obtain, process and/or send data, control data access and storage, issue commands, and control other desired operations. The processing circuit 1710 may include circuitry configured to implement desired programming provided by appropriate media in at least one example. For example, the processing circuit 1710 may be implemented as one or more processors, one or more controllers, and/or other structure configured to execute executable programming. Examples of the processing circuit 1710 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1710 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1710 are for illustration and other suitable configurations within the scope of the disclosure are also contemplated.

According to one or more aspects of the disclosure, the processing circuit 1710 may be adapted to perform any or all of the features, processes, functions, operations and/or routines for any or all of the apparatuses described herein. For example, the processing circuit 1710 may be configured to perform any of the steps, functions, and/or processes described with respect to FIGS. 1-16 and 18. As used herein, the term "adapted" in relation to the processing circuit 1710 may refer to the processing circuit 1710 being one or more of configured, employed, implemented, and/or programmed to perform a particular process, function, operation and/or routine according to various features described herein.

The processing circuit 1710 may be a specialized processor, such as an application-specific integrated circuit (ASIC) that serves as a means for (e.g., structure for) carrying out any one of the operations described in conjunction with FIGS. 1-16 and 18. The processing circuit 1710 serves as one example of a means for sending and/or a means for receiving. In various implementations, the processing circuit 1710 may provide and/or incorporate, at least in part, the functionality described above for the controller 108 or the SSD 104 of FIG. 1.

According to at least one example of the apparatus 1700, the processing circuit 1710 may include one or more of a circuit/module for determining dimensions for a code 1720, a circuit/module for generating circulant rotation values 1722, a circuit/module for assigning circulant rotation values to circulant locations 1724, or a circuit/module for encoding data 1726. In various implementations, the circuit/module for determining dimensions for a code 1720, the circuit/module for generating circulant rotation values 1722, the circuit/module for assigning circulant rotation values to circulant locations 1724, or the circuit/module for encoding data 1726 may provide and/or incorporate, at least in part, the functionality described above for the controller 108 of FIG. 1.

As mentioned above, a program stored by the storage medium 1704, when executed by the processing circuit 1710, causes the processing circuit 1710 to perform one or more of the various functions and/or process operations described herein. For example, the program may cause the processing circuit 1710 to perform the various functions, steps, and/or processes described herein with respect to FIGS. 1-16 and 18 in various implementations. As shown in FIG. 17, the storage medium 1704 may include one or more of code for determining dimensions for a code 1740, code for generating circulant rotation values 1742, code for assigning circulant rotation values to circulant locations 1744, or code for encoding data 1746. In various implementations, the code for determining dimensions for a code 1740, the code for generating circulant rotation values 1742, the code for assigning circulant rotation values to circulant locations 1744, or the code for encoding data 1746 may be executed or otherwise used to provide the functionality described herein for the circuit/module for determining dimensions for a code 1720, the circuit/module for generating circulant rotation values 1722, the circuit/module for assigning circulant rotation values to circulant locations 1724, or the circuit/module for encoding data 1726.

First Example Process

Figure 18:
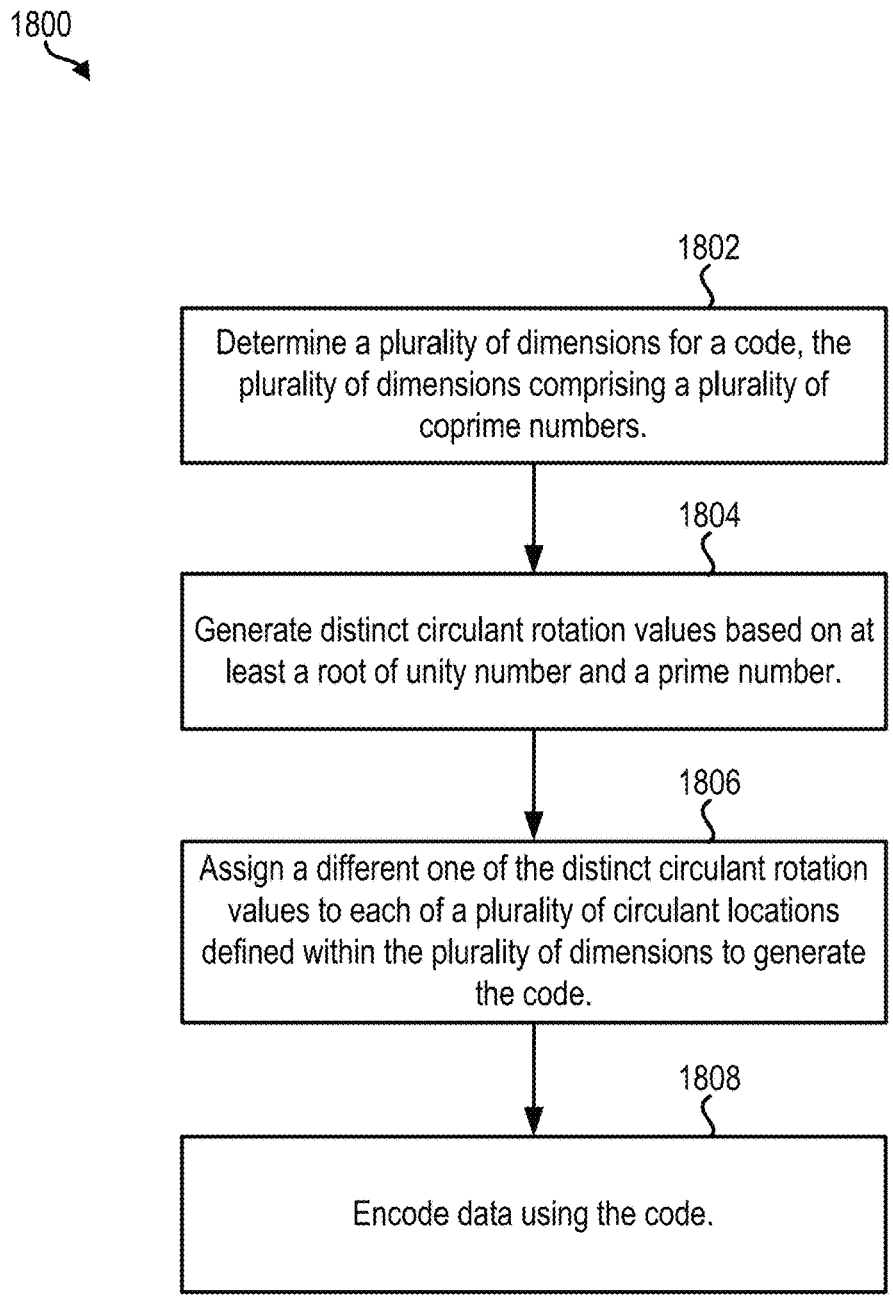
FIG. 18 illustrates a process for communication in accordance with some aspects of the disclosure.

FIG. 18 illustrates a process 1800 for communication in accordance with some aspects of the disclosure. The process 1800 may take place within a processing circuit (e.g., the processing circuit 1710 of FIG. 17), which may be located in a controller, an SSD, a solid state drive, a host device, an NVM device, a NAND die, or some other suitable apparatus. Of course, in various aspects within the scope of the disclosure, the process 1800 may be implemented by any suitable apparatus capable of supporting memory-related operations.

At block 1802, the apparatus determines a plurality of dimensions for a code, the plurality of dimensions comprising a plurality of coprime numbers. In some aspects of the disclosure, the apparatus determines the plurality of dimensions for a code by selecting a prime number (e.g., the prime number M described herein), wherein the prime number corresponds to a square circulant matrix size, and by determining the plurality of coprime numbers based on a number that is one less than the prime number. In some aspects of the disclosure, the plurality of dimensions may include a product of at least two of the plurality of coprime numbers.

In some aspects of the disclosure, the plurality of dimensions includes a first dimension $D_x$ along an x-axis and a second dimension $D_y$ along a y-axis. In such aspects, each circulant location has an x-coordinate e mod $D_x$ and a y-coordinate e mod $D_y$. In some aspects of the disclosure, the plurality of dimensions includes a first dimension $D_x$ along an x-axis, a second dimension $D_y$ along a y-axis, and a third dimension $D_z$ along a z-axis. In such aspects, each circulant location has an x-coordinate e mod $D_x$, a y-coordinate e mod $D_y$, and a z-coordinate e mod $D_z$. In some aspects of the disclosure, the code is a multi-dimensional quasi-cyclic (QC) low-density parity-check (LDPC) code.

At block 1804, the apparatus generate distinct circulant rotation values based on at least a root of unity number and a prime number. In some aspects, the apparatus selects a root of unity number that generates a finite set of unique values based on the expression ($\alpha^e$ mod M) for e=0 to (M−2), where $\alpha$ is the root of unity number, e is an index value, and M is a prime number. The finite set of unique values may serve as the distinct circulant rotation values. In some aspects, each of the distinct circulant rotation values corresponds to one of a plurality of index values, and one of the plurality of index values is assigned to each circulant location. In some aspects of the disclosure, each of the one or more of the distinct circulant rotation values represents a number of columns to be shifted in a circulant square matrix. In some aspects of the disclosure, each of the one or more of the distinct circulant rotation values represents a number of columns to be shifted in a circulant square matrix, the circulant square matrix being an M×M matrix that includes substantially more zeros than ones. In some aspects of the disclosure, each of the one or more of the distinct circulant rotation values represents a unique permutation of a circulant square matrix.

At block 1806, the apparatus assigns a different one of the distinct circulant rotation values to each of a plurality of circulant locations defined within the plurality of dimensions to generate the code. In some aspects of the disclosure, each circulant location and the assigned different one of the distinct circulant rotation values corresponds to one of a plurality of index values. At block 1808, the apparatus encodes data using the code.

In some aspects, a process in accordance with the teachings herein may include any combination of the above operations.

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus, comprising:
   a non-volatile memory (NVM) array; and
   a processor coupled to the NVM array and configured to:
   determine a plurality of dimensions for a code to be generated by selecting a prime number corresponding to a square circulant matrix size and determining a plurality of coprime numbers based on a number that is at least one less than the selected prime number, the plurality of dimensions comprising the plurality of coprime numbers;
   generate distinct circulant rotation values based on at least a root of unity number and a prime number;

assign a different one of the distinct circulant rotation values to each of a plurality of circulant locations defined within the plurality of dimensions to generate the code;

receive data from a host device;

encode the data using the code;

store the encoded data in the NVM array for subsequent retrieval; and recover at least one unreadable portion of retrieved encoded data using the code.

2. The data storage apparatus of claim 1, wherein the processor is further configured to generate the distinct circulant rotation values by:

selecting a particular root of unity number that generates a finite set of unique values based on the expression ($\alpha^e$ mod M) for e=0 to (M−2), where $\alpha$ is the root of unity number, e is an index value, and M is the prime number.

3. The data storage apparatus of claim 1, wherein each of the distinct circulant rotation values corresponds to one of a plurality of index values, and wherein each of the plurality of index values are assigned to each of the plurality of circulant locations.

4. The data storage apparatus of claim 1, wherein each of the one or more of the distinct circulant rotation values represents a number of columns to be shifted in a circulant square matrix.

5. The data storage apparatus of claim 1, wherein each of the one or more of the distinct circulant rotation values represents a number of columns to be shifted in a circulant square matrix, the circulant square matrix comprising an M×M matrix that includes more zeros than ones, wherein M represents the prime number.

6. The data storage apparatus of claim 1, wherein the code is a multi-dimensional quasi-cyclic (QC) low-density parity-check (LDPC) code.

7. A data storage apparatus, comprising:

a non-volatile memory (NVM) array;

a code dimension determiner circuit configured to determine a plurality of dimensions for a code to be generated by selecting a prime number corresponding to a square circulant matrix size and determining a plurality of coprime numbers based on a number that is at least one less than the selected prime number, the plurality of dimensions comprising the plurality of coprime numbers;

a circulant rotation generator circuit configured to generate distinct circulant rotation values based on at least a root of unity number and a prime number;

a circulant rotation assigner circuit configured to assign a different one of the distinct circulant rotation values to each of a plurality of circulant locations defined within the plurality of dimensions to generate the code;

a host interface configured to receive data from a host device;

a data encoding circuit configured to encode the data using the code;

an NVM interface configured to store the encoded data in the NVM array for subsequent retrieval; and a controller configured to recover at least one unreadable portion of retrieved encoded data using the code.

8. The data storage apparatus of claim 7, wherein the circulant rotation generator circuit is further configured to:

select a particular root of unity number that generates a finite set of unique values based on the expression ($\alpha^e$ mod M) for e=0 to (M−2), where $\alpha$ is the root of unity number, e is an index value, and M is the prime number.

9. The data storage apparatus of claim 8, wherein the plurality of dimensions includes a first dimension $D_x$ along an x-axis and a second dimension $D_y$ along a y-axis, and wherein each of the plurality of circulant locations has an x-coordinate e mod $D_x$ and a y-coordinate e mod $D_y$.

10. The data storage apparatus of claim 8, wherein the plurality of dimensions includes a first dimension $D_x$ along an x-axis, a second dimension $D_y$ along a y-axis, and a third dimension $D_z$ along a z-axis, wherein each of the plurality of circulant locations has an x-coordinate e mod $D_x$, a y-coordinate e mod $D_y$, and a z-coordinate e mod D.

11. A method, comprising:

determining a plurality of dimensions for a code to be generated by selecting a prime number corresponding to a square circulant matrix size and determining a plurality of coprime numbers based on a number that is at least one less than the selected prime number, the plurality of dimensions comprising the plurality of coprime numbers;

generating distinct circulant rotation values based on at least a root of unity number and a prime number;

assigning a different one of the distinct circulant rotation values to each of a plurality of circulant locations defined within the plurality of dimensions to generate the code;

receiving data from a host device;

encoding the data using the code;

storing the encoded data in a memory for subsequent retrieval; and recovering at least one unreadable portion of retrieved encoded data using the code.

12. The method of claim 11, wherein generating the distinct circulant rotation values comprises:

selecting a particular root of unity number that generates a finite set of unique values based on the expression ($\alpha^e$ mod M) for e=0 to (M−2), where $\alpha$ is the root of unity number, e is an index value, and M is the prime number.

13. The method of claim 12, wherein each of the one or more of the distinct circulant rotation values represents a unique permutation of the circulant square matrix.

14. The method of claim 13, wherein a first portion of the circulant square matrix comprises a single diagonal of ones and a second portion of the circulant square matrix comprises zeros.

15. The method of claim 11, wherein each of the plurality of circulant locations and the assigned different one of the distinct circulant rotation values corresponds to one of a plurality of index values.

16. A data storage apparatus, comprising:

means for determining a plurality of dimensions for a code to be generated by selecting a prime number corresponding to a square circulant matrix size and determining a plurality of coprime numbers based on a number that is at least one less than the selected prime number, the plurality of dimensions comprising the plurality of coprime numbers;

means for generating distinct circulant rotation values based on at least a root of unity number and a prime number;

means for assigning a different one of the distinct circulant rotation values to each of a plurality of circulant locations defined within the plurality of dimensions to generate the code;

means for receiving data from a host device;

means for encoding the data using the code;

means for storing the encoded data in a memory for subsequent retrieval; and means for recovering at least one unreadable portion of retrieved encoded data using the code.

17. The data storage apparatus of claim 16, wherein the means for generating the distinct circulant rotation values is configured to:

select a particular root of unity number that generates a finite set of unique values based on the expression ($\alpha^e$ mod M) for e=0 to (M−2), where $\alpha$ is the root of unity number, e is an index value, and M is the prime number.

18. The data storage apparatus of claim 17, wherein the plurality of dimensions further comprises a product of at least two of the plurality of coprime numbers.

19. The data storage apparatus of claim 1, wherein the number that is at least one less than the selected prime number is the selected prime number minus 1.

20. The data storage apparatus of claim 7, wherein the number that is at least one less than the selected prime number is the selected prime number minus 1.

21. The method of claim 11, wherein the number that is at least one less than the selected prime number is the selected prime number minus 1.

22. The data storage apparatus of claim 16, wherein the number that is at least one less than the selected prime number is the selected prime number minus 1.

* * * * *